(12) United States Patent
Nishimura et al.

(10) Patent No.: US 10,905,945 B2
(45) Date of Patent: Feb. 2, 2021

(54) GAME MACHINE AND COMPUTER PROGRAM THEREOF

(71) Applicant: KONAMI DIGITAL ENTERTAINMENT CO., LTD., Tokyo (JP)

(72) Inventors: Kazuya Nishimura, Tokyo (JP); Toru Makino, Tokyo (JP)

(73) Assignee: KONAMI DIGITAL ENTERTAINMENT CO., LTD., Tokyo (JP)

( * ) Notice: Subject to any disclaimer, the term of this patent is extended or adjusted under 35 U.S.C. 154(b) by 272 days.

(21) Appl. No.: 15/998,519

(22) Filed: Aug. 16, 2018

(65) Prior Publication Data
US 2018/0353847 A1 Dec. 13, 2018

Related U.S. Application Data

(63) Continuation of application No. PCT/JP2017/005448, filed on Feb. 15, 2017.

(30) Foreign Application Priority Data

Feb. 16, 2016 (JP) ................................. 2016-027431

(51) Int. Cl.
*A63F 13/814* (2014.01)
*A63F 13/44* (2014.01)
(Continued)

(52) U.S. Cl.
CPC ........ *A63F 13/214* (2014.09); *A63F 13/2145* (2014.09); *A63F 13/426* (2014.09);
(Continued)

(58) Field of Classification Search
CPC ........ A63F 13/44; A63F 13/814; G10H 1/368
See application file for complete search history.

(56) References Cited

U.S. PATENT DOCUMENTS

| 6,554,711 B1 * | 4/2003 | Kawasaki ............. A63F 13/005 463/43 |
| 10,002,542 B1 * | 6/2018 | Jenkins .................... G10G 1/02 |

(Continued)

FOREIGN PATENT DOCUMENTS

| JP | 2001145778 A | 5/2001 |
| JP | 2005087717 A | 4/2005 |

(Continued)

OTHER PUBLICATIONS

Communication dated Mar. 21, 2019 from the Korean Intellectual Property Office in counterpart KR Application No. 10-2018-7023485.

(Continued)

*Primary Examiner* — Jay Trent Liddle
(74) *Attorney, Agent, or Firm* — Sughrue Mion, PLLC

(57) ABSTRACT

A game machine includes an input device that is capable of detecting a position at which a user performs an operation, and a control device that commands the user respective positions and timings at which a plurality of operations is to be performed by the user upon the input device, and that evaluates the operations by the user: wherein the control device includes an operation determination device that determines presence or absence of an operation corresponding to a command for any one operation, on the basis of whether or not the operation has been detected within a range of determination; and when an operation is detected in an overlapped region between ranges of determination, the operation determination device allocates an operation detected in the overlapped region as an operation detected in one of the ranges, and excludes the operation in relation to another of the ranges.

10 Claims, 16 Drawing Sheets

(51) Int. Cl.
  *A63F 13/214* (2014.01)
  *A63F 13/426* (2014.01)
  *A63F 13/2145* (2014.01)
  *A63F 13/53* (2014.01)
  *G06F 3/046* (2006.01)
  *H03K 17/96* (2006.01)

(52) U.S. Cl.
  CPC ............. *A63F 13/44* (2014.09); *A63F 13/53* (2014.09); *A63F 13/814* (2014.09); *G06F 3/046* (2013.01); *H03K 17/96* (2013.01); *G06F 2203/04104* (2013.01); *H03K 2017/9606* (2013.01)

(56) References Cited

U.S. PATENT DOCUMENTS

| | | | | |
|---|---|---|---|---|
| 10,179,278 | B2* | 1/2019 | Hirosawa | A63F 13/06 |
| 2002/0054127 | A1* | 5/2002 | Omori | G10H 1/0008 |
| | | | | 715/781 |
| 2002/0177113 | A1* | 11/2002 | Sherlock | G09B 15/08 |
| | | | | 434/308 |
| 2004/0137984 | A1* | 7/2004 | Salter | A63F 13/44 |
| | | | | 463/35 |
| 2010/0184497 | A1* | 7/2010 | Cichowlas | A63F 13/814 |
| | | | | 463/7 |
| 2010/0257993 | A1* | 10/2010 | Brow | A63F 13/814 |
| | | | | 84/478 |
| 2013/0000463 | A1* | 1/2013 | Grover | G06Q 30/04 |
| | | | | 84/483.2 |
| 2013/0053114 | A1* | 2/2013 | Nishimura | A63F 13/54 |
| | | | | 463/7 |
| 2013/0130761 | A1* | 5/2013 | Hayashi | A63F 13/005 |
| | | | | 463/7 |
| 2013/0319208 | A1* | 12/2013 | Forrest | G09B 15/023 |
| | | | | 84/478 |
| 2014/0349761 | A1* | 11/2014 | Kruge | A63F 13/44 |
| | | | | 463/35 |

FOREIGN PATENT DOCUMENTS

| | | | |
|---|---|---|---|
| JP | 2005103241 | A | 4/2005 |
| JP | 4847997 | B2 | 12/2011 |
| JP | 201479398 | A | 5/2014 |
| JP | 201558156 | A | 3/2015 |
| JP | 5830135 | B1 | 12/2015 |
| JP | 2016-2165 | A | 1/2016 |

OTHER PUBLICATIONS

Communication dated Apr. 10, 2019 from the Korean Intellectual Property Office in application No. 10-2018-7023486.
International Search Report in corresponding International Application No. PCT/JP2017/005448, dated Apr. 11, 2017.
Written Opinion in corresponding International Application No. PCT/JP2017/005448, dated Apr. 11, 2017.
Communication dated Sep. 30, 2016, from the Japanese Patent Office in counterpart application No. 2016-027431.
Communication dated Mar. 31, 2017, from the Japanese Patent Office in counterpart application No. 2016-027431.
International Search Report in corresponding International Application No. PCT/JP2017/005445, dated May 16, 2017.
Written Opinion in corresponding International Application No. PCT/JP2017/005445, dated May 16, 2017.
Communication dated Aug. 22, 2016, from the Japanese Patent Office in counterpart application No. 2016-027425.
Communication dated Jan. 26, 2017, from the Japanese Patent Office in counterpart application No. 2016-027425.
Written Decision on Registration dated Sep. 24, 2019 issued by the Korean Intellectual Property Office in Application No. 10-2018-7023485.
Notice of Allowance dated Sep. 16, 2019 issued by the United States Patent and Trademark Office in U.S. Appl. No. 15/998,523.

* cited by examiner

GAME MACHINE AND COMPUTER PROGRAM THEREOF

This application is a Continuation of PCT/JP2017/005448 filed Feb. 15, 2017, which is a § 371 National Stage Application which claims priority to JP 2016-027431 filed Feb. 16, 2016, the disclosure of each is incorporated herein by reference.

BACKGROUND OF THE INVENTION

Field of the Invention

The present invention relates to a game machine that evaluates operations by the user by comparing together positions at which operation has been commanded and positions at which operation has been detected.

Description of the Related Art

As one example of a game machine that commands a user to perform operations matched to music, a game machine is per se known (for example, refer to Patent Document #1) that comprises an input device upon which physical operation members being a plurality of operation members are arranged linearly along a predetermined direction at fixed intervals like a keyboard of a musical instrument, and that commands the user via a display device as to which operation members are to be operated at what timings, and evaluates the play of the user on the basis of comparisons between these commands and the operations actually performed by the user. And a game machine is per se known (for example, refer to Patent Document #2) that, by employing a touch panel input device instead of an input device having physical operation members, determines whether or not the user is operating commanded operation member correctly by determining, when an object that is shifting upon the screen has reached any of the plurality of operation members set on the touch panel input device, whether or not that operation member has been touched.

CITATION LIST

Patent Literature

Patent Document #1: Japanese Laid-Open Patent Publication 2001-145778.
Patent Document #2: Japanese Laid-Open Patent Publication 2014-79398.

SUMMARY OF THE INVENTION

In either case, i.e. irrespective of whether a touch panel input device is employed or an input device having physical operation members is employed, in order to determine about an operation by the user, a range of determination that takes the position of the commanded operation as a reference is taken as a subject, and it is determined whether or not operation within this determination range has been detected. However, if a plurality of simultaneous operations whose positions are different are designated, then sometimes an overlapped region occurs between two ranges of determination that are respectively set to correspond to the positions of these two operations, and sometimes it may happen that an operation is detected in this overlapped region. In that case, for such an operation that has been detected in the overlapped region, it is necessary to perform processing in an appropriate manner in relation to the ranges of determination.

Accordingly, the object of the present invention is to provide a game machine etc. that is capable of performing appropriate processing when an operation is detected in an overlapped region between ranges of determination for a plurality of operations that are commanded simultaneously.

A game machine according to one aspect of the present invention comprises an input device that is capable of detecting a position at which a user performs an operation, and a control device that commands the user respective positions and timings at which a plurality of operations is to be performed by the user upon the input device, and that evaluates the operations by the user on the basis of comparison between the commanded operations and the operations performed by the user and detected by the input device: wherein the control device comprises an operation determination device that determines presence or absence of an operation corresponding to a command for any one operation, on the basis of whether or not the operation has been detected within a range of determination that is set to a predetermined width in a predetermined direction with reference to a position at which the one operation is to be performed in response to the command; and when simultaneous operations at two or more different positions in relation to the predetermined direction are commanded and an overlapped region is generated between ranges of determination to be set corresponding to those operations, and when an operation is detected in the overlapped region, the operation determination device allocates an operation detected in the overlapped region as an operation detected in one of the ranges of determination with respect to the overlapped region, and determines as to whether or not an operation in another of the ranges of determination has been detected by excluding the operation allocated to the one range of determination in relation to the other range of determination.

And a non-transitory computer readable recording medium storing a computer program according to one aspect of the present invention is configured to cause a computer of a game machine comprising an input device that is capable of detecting a position at which a user performs an operation to function as a control device that commands the user respective positions and timings at which a plurality of operations is to be performed by the user upon the input device, and that evaluates the operations by the user on the basis of comparison between the commanded operations and the operations performed by the user and detected by the input device; wherein the computer program: causes the control device to function as an operation determination device that determines presence or absence of an operation corresponding to a command for any one operation, on the basis of whether or not the operation has been detected within a range of determination that is set to a predetermined width in a predetermined direction with reference to a position at which the one operation is to be performed in response to the command; and when simultaneous operations at two or more different positions in relation to the predetermined direction are commanded and an overlapped region is generated between ranges of determination to be set corresponding to those operations, and when an operation is detected in the overlapped region, the operation determination device allocates an operation detected in the overlapped region as an operation detected in one of the ranges of determination with respect to the overlapped region, and determines as to whether or not an operation in another of the ranges of determination has been detected by excluding the operation allocated to the one range of determination in relation to the other range of determination.

DESCRIPTION OF THE EMBODIMENTS

Figure 1:
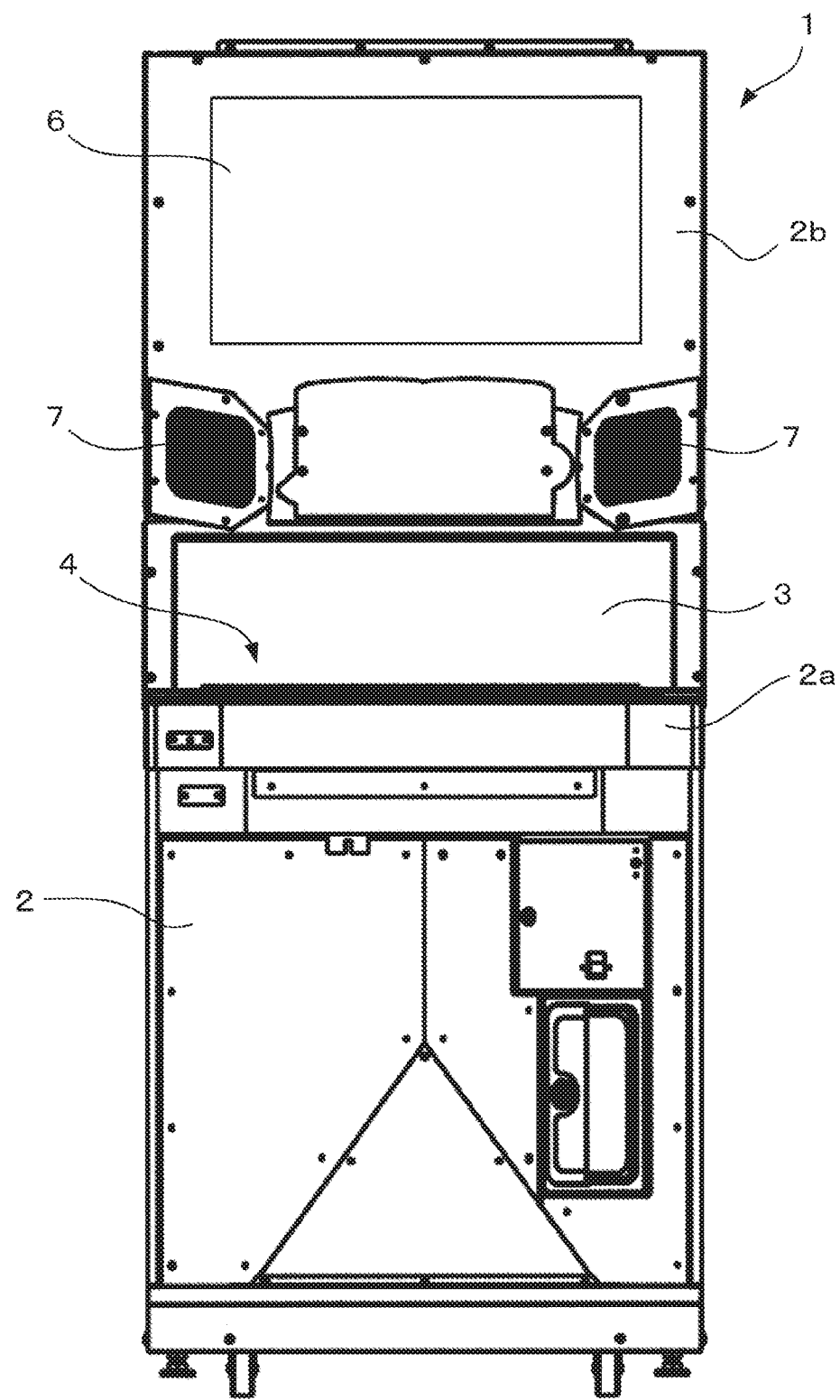
FIG. 1 is an elevation view of a game machine according to an embodiment of the present invention.
Figure 2:
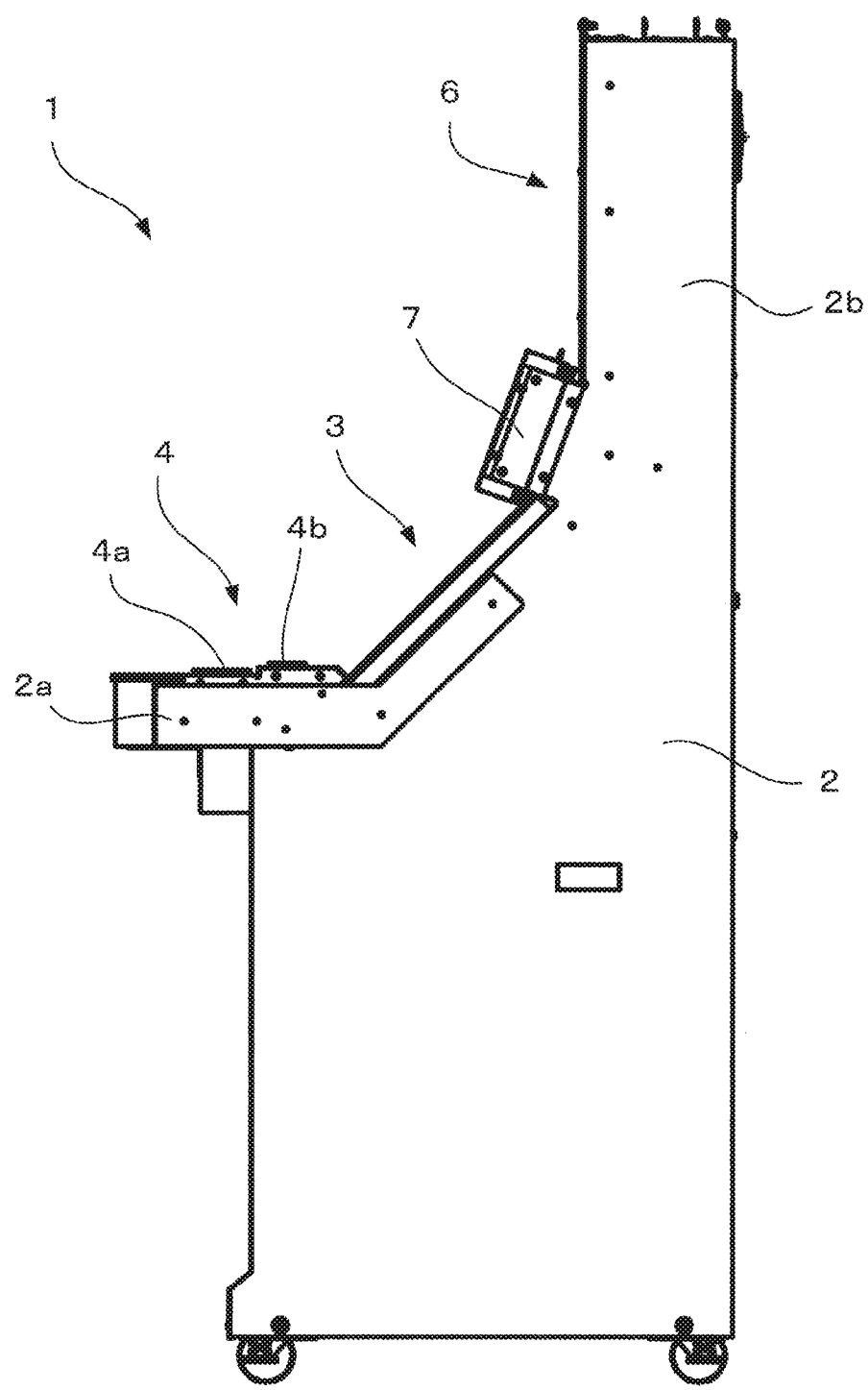
FIG. 2 is a right side view of this game machine according to an embodiment of the present invention.
Figure 3:
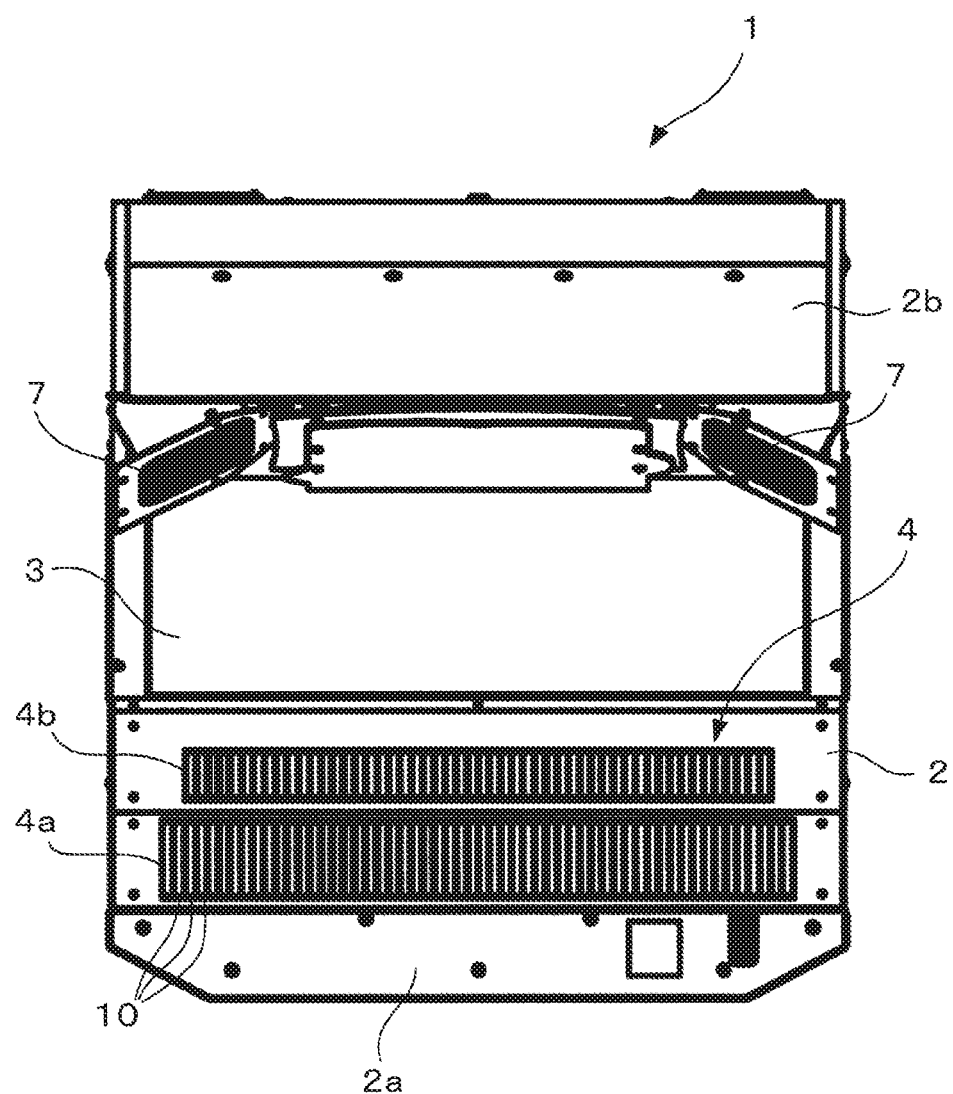
FIG. 3 is a plan view of the game machine according to an embodiment of the present invention.

FIGS. 1 through 3 show the external appearance and construction of a game machine according to an embodiment of the present invention. This game machine 1 has a casing 2, a main monitor 3 that is attached to the casing 2 and that is one example of a display device, and an input system 4 that is disposed on a control panel section 2a in front of the main monitor 3. For example, a flat panel display such as a liquid crystal monitor or the like may be employed as the main monitor 3. The main monitor 3 is attached to the casing 2 so that its display surface faces diagonally upward. The input system 4 is provided so as to be located in front of the main monitor 3 when seen from the point of view of the user when the user is standing in front of the casing 2 so as to face the main monitor 3, and moreover so as to extend from one end portion of the main monitor 3 in the transverse direction to its other end portion. In the following, when specifying a reference direction based upon the user, unless otherwise particularly specified, this will be supposed to mean a direction based upon the state in which the user is standing and facing the main monitor 3. Moreover, a top panel portion 2b is provided on an upper end side of the main monitor 3 in the casing 2, and a sub-monitor 6 is provided on this top panel portion 2b. This sub-monitor 6 is employed as a display device for performing a game, or for presenting predetermined information to the user. Moreover, speakers 7 are provided on the left and right sides on a lower end side of the sub-monitor 6.

The input system 4 includes a first input unit 4a that is positioned more toward the front from the point of view of the user and a second input unit 4b that is positioned more toward the rear than the first input unit 4a. As is apparent from FIG. 2, the second input unit 4b is arranged at a position that is slightly higher than the first input unit 4a. In each of the first input unit 4a and the second input unit 4b, a plurality of operation members 10 are provided and arranged linearly at regular intervals along the left to right direction from the point of view of the user. These operation members 10 are formed in the shape of keys that, from the point of view of the user, are longer in the front to rear direction and shorter in the left to right direction. The numbers of operation members 10 on the first input unit 4a and the second input unit 4b are different, and also the lengths in the front to rear direction of the operation members 10 on the two input units are different, but the spaces between the operation members 10 are the same. In this game machine 1, the operation members 10 correspond to examples of the "operation units".

Figure 4:
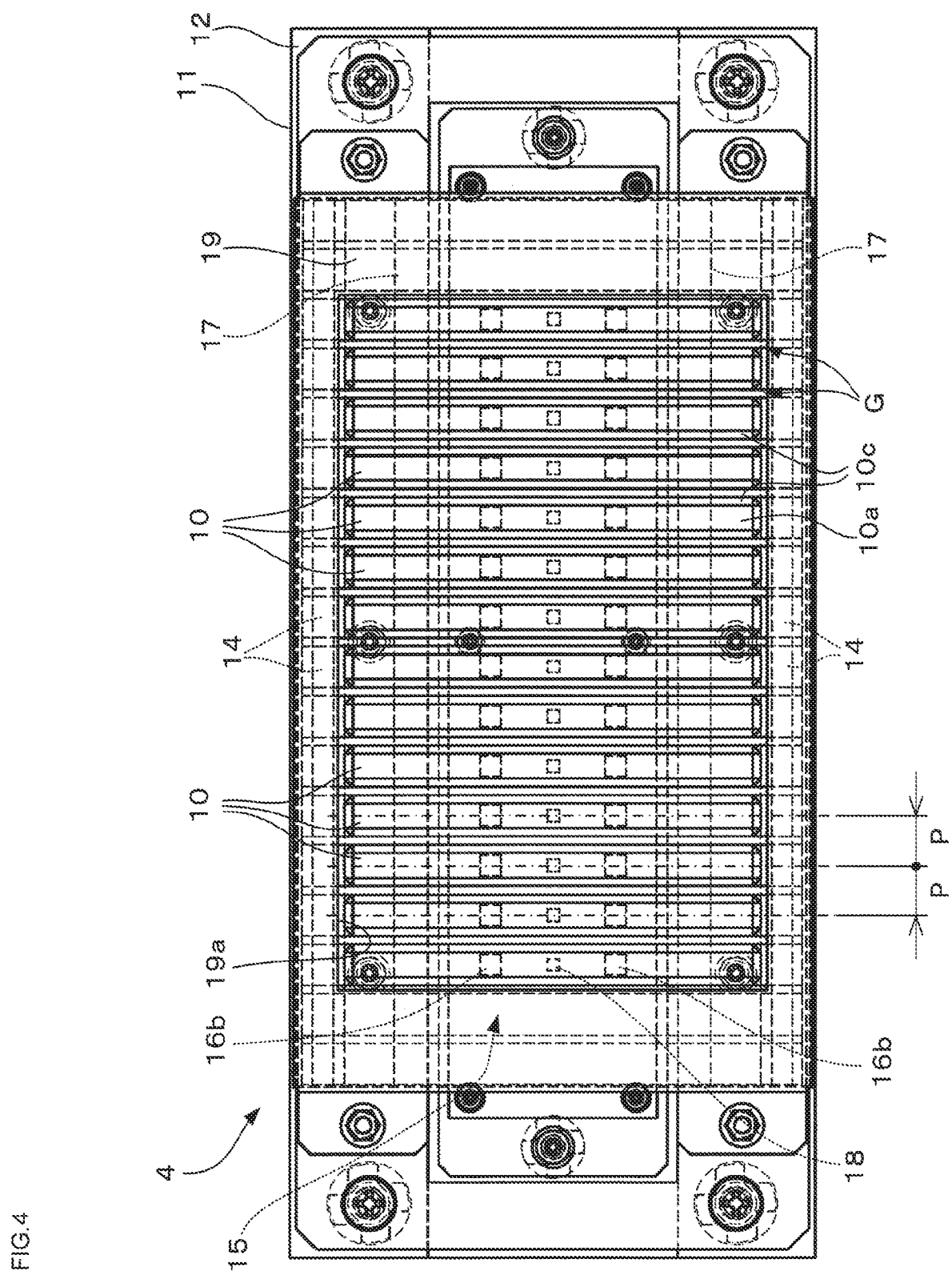
FIG. 4 is a plan view of principal portions of an input device.
Figure 5:
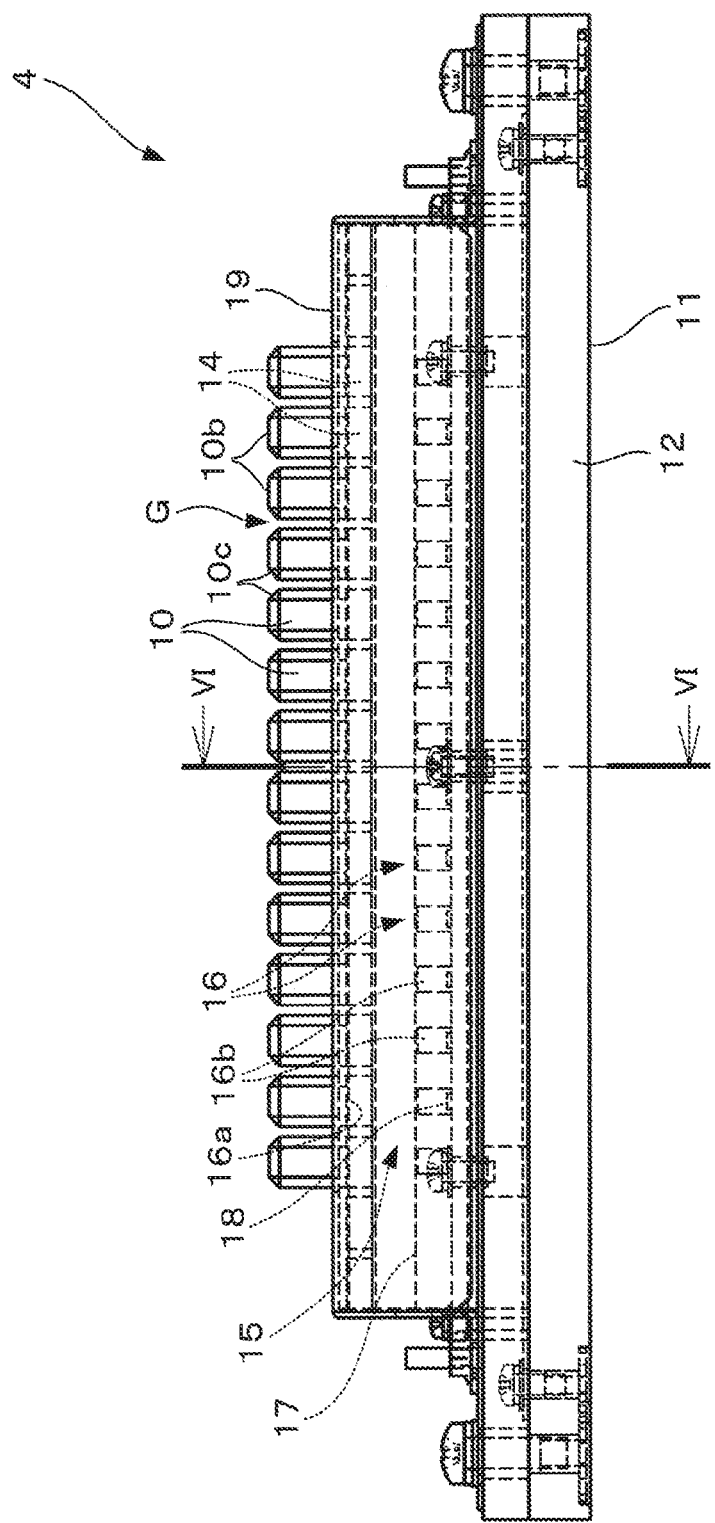
FIG. 5 is a side view of principal portions of the input device.
Figure 6:
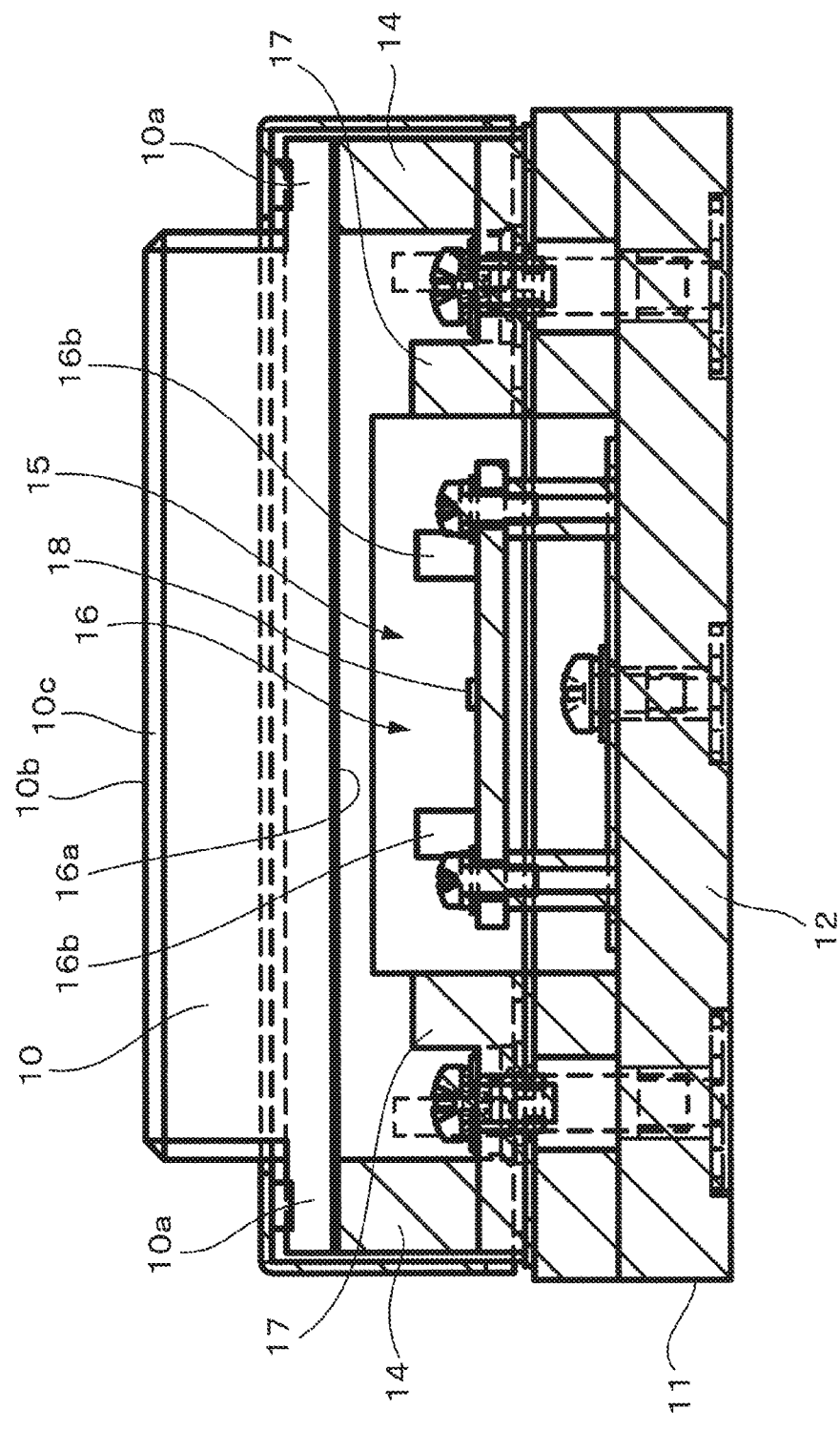
FIG. 6 is a sectional view of FIG. 5 taken along lines VI-VI.

Now the structure of the input system 4 will be explained with reference to FIGS. 4 through 6. It should be understood that, while FIGS. 4 through 6 show a portion of the first input unit 4a, the number of operation members 10 that are illustrated is less than the number on the actual first input unit 4a. Moreover, on the second input unit 4b, the front to rear lengths of the operation members 10 are different, but the structure is the same. Accordingly, the explanation of the first input unit 4a may be referred to for details of the second input unit 4b.

As shown in FIGS. 4 through 6, a support base 11, which is one example of a support structure, is also provided to the input system 4, in addition to the large number of operation members 10. The support base 11 has a base 12 and a large number of elastic support units 14 that are arranged along the front or rear edge portion of this base 12. The elastic support units 14 are provided independently from the operation members 10. The operation members 10 are supported upon the support base 11 by flange portions 10a at their front and rear edges being superimposed upon the elastic support units 14, so that each of them bridges between two of the elastic support portions 14. When one of the operation members 10 is operated by being pressed, one or both of its elastic support units 14 can be deformed by being elastically compressed. Thus, due to the restoring force of the elastic support units 14 against elastic deformation, each of the operation members 10 is held at its initial position in the vertical direction. In their initial positions, the upper surfaces 10b of the operation members 10 are positioned at equal heights in the vertical direction. Since two of the elastic support units 14 are provided for each of the operation members 10, accordingly it is possible to operate each of the operation members 10 independently by pressing it down. For example, sponge-like resin blocks may be used for the elastic support units 14. Any of various elastic materials may be used as material for the elastic support units 14, such as, for example, rubber, elastomer, coil springs, or the like.

The spacing P at which the operation members 10 are linearly arranged (which corresponds to the pitch of the operation members 10 in the left to right direction) is set within a range such that, if the user operates one of the operation members 10 accurately at its center position in the left to right direction, then it is possible for the user to operate that operation member 10 without the user's finger touching and getting caught against the operation members 10 that are adjacent to that operation member 10 on its left and right sides, and such that, on the other hand, when the user performs pressing operation with a finger somewhat displaced from the center position of the operation member 10, then the finger touches the adjacent operation member 10 on the left side or the right side, and catches against that adjacent operation member 10 so that it becomes involved in the operation. For example, the spacing P at which the operation members 10 are arranged may be set to be clearly smaller than the width of one key (a white key) of a keyboard musical instrument such as a typical piano or the like. For example, the spacing P may be set to a width that is approximately the same as the width of one finger of a typical adult male. As a guide, the spacing P is set so that, if operation is performed by pressing accurately at the center position of one of the operation members 10 in its widthwise direction, then it is possible to operate that single operation member without catching against and involving either of the adjacent operation members 10, whereas on the other hand, if the position at which the operation member 10 is operated by being pressed down deviates even slightly to left or right from the center of the operation member 10 in the widthwise direction, then, as operation is performed, one of the adjacent operation members 10 is inevitably touched by the finger of the user and is caught against and becomes involved. As one example, this type of spacing P may be around 11 to 12 mm.

As is clear from FIG. 5, a certain gap G is provided between adjacent ones of the operation members 10. Edge processed sections 10c are provided along both side edges of the upper surface 10b of each operation member 10 in its longitudinal direction, these edges being shaped along their entire lengths by processing such as chamfering so as to eliminate their abrupt corner edge portions. Due to this, the gap G is widened in the vicinity of the upper surfaces 10b of the operation members 10. This gap G provides the beneficial operational effect of visually separating between adjacent ones of the operation members 10, so that it becomes easier for the user to perform pushing down operation upon a single one of the operation members 10 in a situation in which their spacing P is set to be tight. By enlarging the gaps G in the vicinity of the upper surfaces 10b, it becomes possible further to enhance this type of beneficial operational effect. Furthermore, by providing the edge processed sections 10c, the advantage is obtained that it is possible to perform operation according to the so called glissando playing style in which the user operates the plurality of operation members 10 in turn by sliding a finger to left and right. It should be understood that the shape of the edge processed sections 10c is not limited to being a chamfered shape, they could also be formed in rounded shapes by rounding processing.

As shown in FIG. 6, a detection mechanism 15 for detecting operation of the operation members 10 is provided internally to the support base 11. This detection mechanism 15 has the same number of detection units 16 as the number of operation members 10, one detection unit 16 being provided for each of the operation members 10. Each one of the detection units 16 detects pushing down operation of its corresponding operation member 10 and outputs a predetermined detection signal. Accordingly, the detection mechanism 15 is capable of detecting pushing down operation of each of the operation members 10 independently. For example, each of the detection units 16 may comprise a magnet 16a (which is one example of a detection subject unit) that is attached to the lower surface of its corresponding operation member 10, and a pair of magnetic sensors 16b (which are one example of a sensor unit) that are fixed to the support base 11 so as to confront the magnet 16a in the vertical direction.

The magnetic sensors 16b are per se known sensor elements whose output signals change according to the strength of a magnetic field. When the operation member 10 is operated by being pushed down, the distance between the magnet 16a and the magnetic sensors 16b changes according to the operation quantity of this pushing down operation. Due to this, the strength of the magnetic field around the magnetic sensors 16b changes, and the output signals from the magnetic sensors 16b changes according to the operation quantity of the pushing down operation. Accordingly, on the basis of the output signals of the magnetic sensors 16b, it is possible to detect physical quantities such as the operation quantity of the operation member 10, and/or the speed at which it is operated, and/or the acceleration of its operation. Stoppers 17 are provided on both sides of the magnetic sensors 16b in order to limit the range by which the operation member 10 can be operated by being pushed down, so that the magnet 16a does not contact the magnetic sensors 16b. A LED light emitting element 18 is provided between the magnetic sensors 16b. The operation member 10 is made to have an optical characteristic such that it transmits light emitted from the LED light emitting element 18 while scattering that light to a certain extent. As a result, the operation member 10 receives the light from the LED light emitting element 18 and emits it in a moderate manner. It should be understood that, for the sensor units, it would also be possible to employ sensors of any of various types whose output signals change according to the distance to a subject for detection, such as proximity sensors or optical sensors or the like, instead of the magnetic sensors 16b.

A cover 19 is provided to the support base 11. This cover 19 is attached to the support base 11 so as to cover over and conceal from the exterior the elastic support units 14 and the flange portions 10a of the operation members 10 that are disposed over them. The cover 19 is provided with cutout windows 19a (refer to FIG. 4), and portions of the operation members 10 other than their flange portions 10a project upward from these cutout windows 19a.

Figure 7:
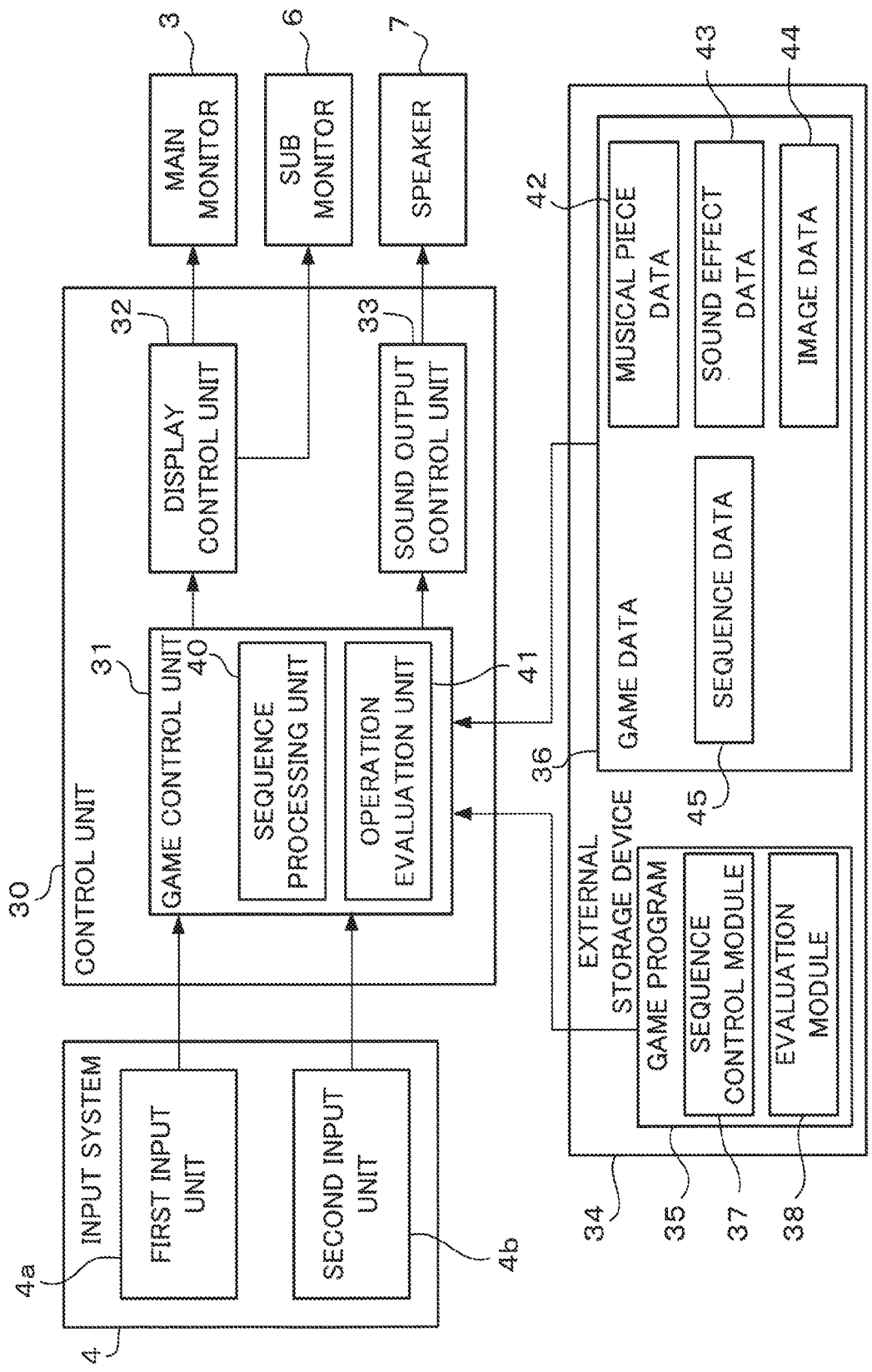
FIG. 7 is a block diagram showing the general structure of a control system of the game machine.

Next, the structure of the control system for this game machine 1 will be explained with reference to FIG. 7. As shown in FIG. 7, a control unit 30 is provided to the game machine 1 and serves as a computer. This control unit 30 has a game control unit 31 that serves as a main controller, a display control unit 32 that generates video signals to be displayed upon the main monitor 3 and the sub-monitor 6 according to commands from this game control unit 31, and a sound output control unit 33 that generates reproduced sound signals to be outputted from the speakers 7 of the game machine 1 (refer to FIG. 1) according to commands from the game control unit 31. The first input unit 4a and the second input unit 4b of the input system 4 are connected to the game control unit 31. The output signals of the magnetic sensors 16b of the detection mechanisms 15 are inputted from each of the input units 4a and 4b. Due to this, the game control unit 31 is able to detect the operation quantity of each of the operation members 10 individually. Furthermore, input devices of various other types may be connected to the game control unit 31, but no such devices are shown in the figures. Yet further, an external storage device 34 is connected to the game control unit 31. A storage medium that is capable of maintaining its stored contents even without supply of power is used for this external storage device 34, for example a non-volatile semiconductor memory device such as an EEPROM or the like or a magnetic storage device.

A game program 35 and game data 36 are recorded in an external storage device 34. The game program 35 is a computer program that is required for execution of a music game by the game machine 1 according to a predetermined procedure, and, for doing this, includes a sequence control module 37 and an evaluation module 38 that are required for execution of the music game. This music game is a type of game in which the user is commanded to perform various operations matched to music, and the play of the user is evaluated by comparing these commands with the actual operations performed by the user. When the game machine 1 is started, by executing an operation program that is recorded in an internal storage device, the game control unit 31 establishes initial settings of various types that are necessary for operation as the game machine 1, and then sets up the environment for execution of the music game by reading in and executing the game program 35 from the external storage device 34. A sequence processing unit 40 is created in the game control unit 31 by the sequence control module 37 of the game program 35 being executed by the game control unit 31. Furthermore, an operation evaluation unit 41 is created in the game control unit 31 by the evaluation module 38 of the game program 35 being executed by the game control unit 31. The sequence processing unit 40 and the evaluation unit 41 are logical devices that are implemented by combinations of computer hardware and a computer program.

The sequence processing unit 40 executes processing of various types required for playing the musical game, such as commanding the user to perform various operations matched to the replaying of music (i.e. of a musical piece) that has been selected by the user as a player, and also generating sound effects according to operations by the user. And the operation evaluation unit 41 evaluates operations by the user, and moreover executes processing to control the game according to the results of these evaluations. It should be understood that, other than the modules 37 and 38 described above, the game program 35 also includes program modules of various other types that are required for executing the music game, and logical devices corresponding to those modules are generated in the game control unit 31, but these are not shown in the figures.

The game data 36 includes data of various types to be referred to during execution of the music game according to the game program 35. For example, this game data 36 includes musical piece data 42, sound effect data 43, and image data 44. The musical piece data 42 is data required for replaying the musical piece that is the subject of the game to be reproduced and outputted from the speakers 7. In FIG. 7 musical piece data 42 of one type is shown, but actually musical piece data 42 corresponding to each of a plurality of musical pieces that can be selected by the user is prepared. The sound effect data 43 is data for replaying sound effects that are to be reproduced during playing of the music game, for example sound effects and so on that are to be outputted from the speakers 7 in response to operation by the user. And the image data 44 is data required for displaying display elements (or image elements) upon the monitors 3 and 6, such as background images, objects of various types, icons and so on that are to be displayed in the game screens.

The game data 36 further includes sequence data 45. This sequence data 45 is data in which are defined operations that the user must perform while playing the music game. At a minimum, one item of sequence data 45 is prepared for the musical piece data 42 for one musical piece. Information is recorded in the sequence data 45 for specifying positions and timings for operations of the input system 4 for which commands are to be given to the user. There may be recorded in the sequence data 45 information designating the timing of an operation, for example, information designating the elapsed time from the start of playing the game or a position in the musical piece.

On the other hand, as information for designating the positions of operations, a unique operation unit number is set for each of the operation members 10 of the input system 4, and information designating which of the operation members 10 is to be operated using operation unit numbers is recorded in the sequence data 45. Information designating the position and timing of each operation is recorded in correspondence so as to form a pair. For example, sequence data 45 may be created so as to designate which of the operation members 10 is to be operated at what timing in the game. It should be understood that in some cases operation of two or more of the operation members 10 is designated at the same operational timing. Furthermore, if a mixture of operations upon the first input unit 4a and upon the second input unit 4b are to be commanded, then information may be included in the sequence data 45 for designating which of the first input unit 4a and the second input unit 4b is to be operated. However, if it is possible to distinguish the first input unit 4a and the second input unit 4b by the operation unit numbers that are allocated to each of the operation members 10, then it will be acceptable to omit such added information that designates the first input unit 4a or the second input unit 4b.

Figure 8:
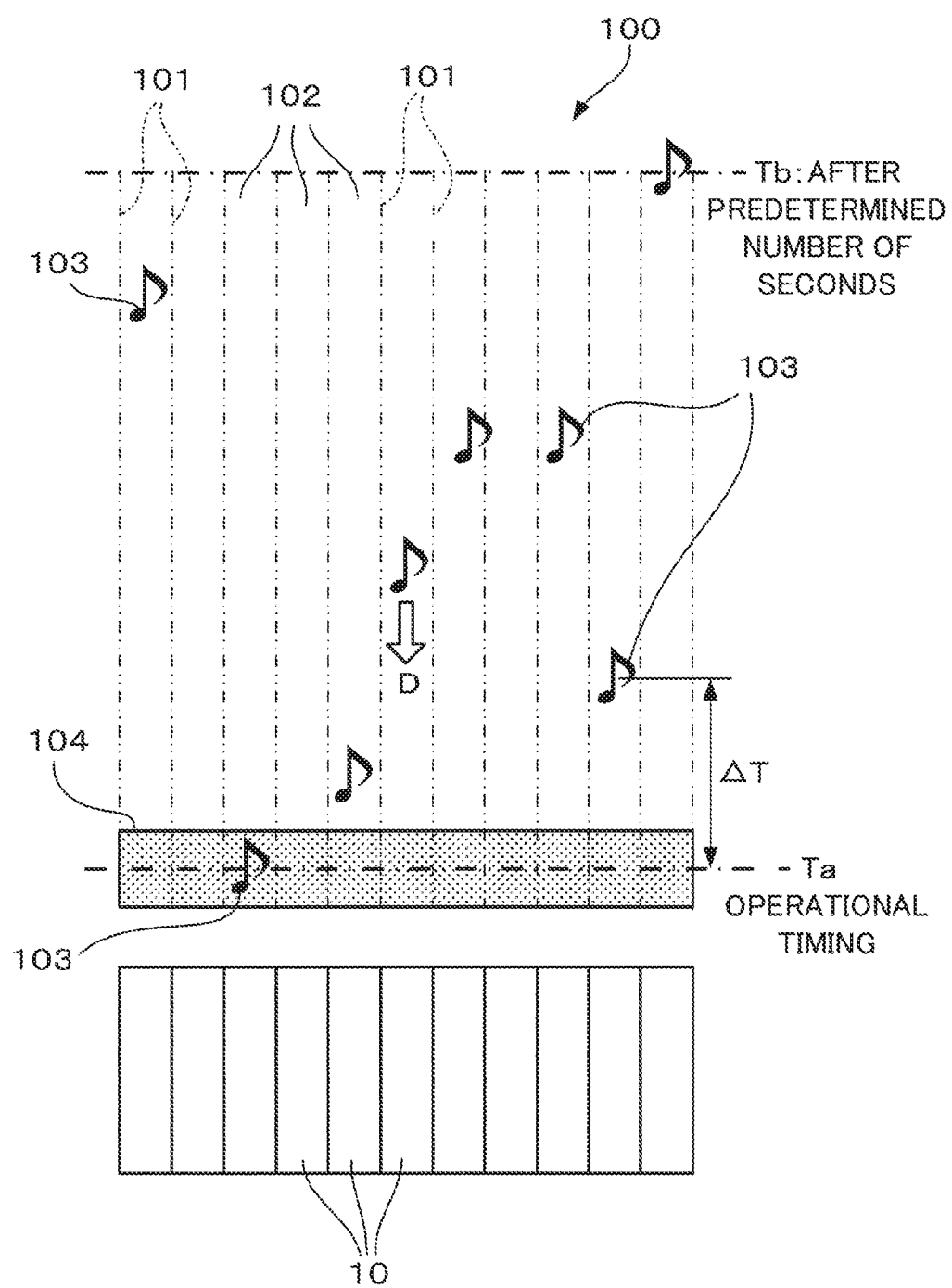
FIG. 8 is a figure showing an example of an operation commanding screen.

On the basis of the sequence data 45, the sequence processing unit 40 commands the user to operate each operation members 10 via the main monitor 3. FIG. 8 shows an example of an operation command screen that the sequence processing unit 40 presents to the user via the main monitor 3. It should be understood that FIG. 8 is drawn for only some of the operation members 10. First, the basic structure of the operation command screen 100 will be explained. A plurality of lanes 102 are set in the left to right direction upon the operation command screen 100 by subdividing it with a plurality of partition lines 101. These dividing lines 101 may be displayed, or alternatively may not be displayed. The intervals between the lanes 102 match the spacing P of the operation members 10 of the first input unit 4a, and the number of lanes 102 matches the number of operation members 10 of the first input unit 4a. From the point of view of the user, the positions in the transverse direction of the lanes 102 and the positions in the transverse direction of the operation members 10 of the first input unit 4a almost match. Due to this, a one-to-one correspondence is established between the operation members 10 of the first input unit 4a and the lanes 102, and, from the point of view of the user, the lane 102 that corresponds to one of the operation members 10 is positioned upon the extended line from that operation member 10 in the front to rear direction.

It should be understood that the gaps between the operation members 10 of the second input unit 4b match those of the first input unit 4a. The operation members 10 are in the same positions on the first input unit 4a and on the second input unit 4b. To put it in another manner, the operation members 10 of the second input unit 4b are positioned upon the extended lines from the operation members 10 of the first input unit 4a. Due to this, the lanes 102 are also in a one-to-one correspondence relationship with the operation members 10 of the second input unit 4b. However, it would also be acceptable for the operation members 10 of the second input unit 4b to be arranged as being displaced in the transverse direction by just a half of the spacing P of the operation members 10 of the first input unit 4a. In that case, a position on each of the dividing lines 101 corresponds to one of the operation members 10 of the second input unit 4b. In the following, the explanation will be continued by taking an example in which a command is given for operation upon an operation member 10 of the first input unit 4a. It should be understood that although the operation members are shown in FIG. 8 in order to display the correspondence relationship between the lanes 102 and the operation members 10, it would also be acceptable to display an image imitating the operation members 10 below the lanes 102 on the operation command screen 100.

Symbols 103 are displayed in the lanes 102 in order to designate the positions of the operation members 10 that are to be operated by the user and the timings at which they are to be operated. As one example, the symbols 103 in the shape of musical notes are shown. The symbols 103 are displayed upon the lanes 102 that correspond to the operation members 10 to be operated by the user. In other words, depending on which lane 102 the symbol 103 is displayed, the position at which the user should perform an operation is designated. Each of the symbols 103 appears at the upper end of its lane 102 at a predetermined time point, and gradually comes down the lane 102 as shown by the arrow sign D along with progression of performance of the musical piece. The symbol 103 comes into a reference region 104 at the lower end portions of the lanes 102 at the timing at which the operation member 10 is to be operated. By doing this, the timing is designated at which the operation member 10 that corresponds to that symbol 103 is to be operated. In FIG. 8, the symbol 103 in the lane 102 which is the third from the left superimposes over the reference region 104. It is possible for the user to operate the operation member 10 located at the position designated by the symbol 103 at the timing designated by the symbol 103 by operating the operation member 10 corresponding to the lane 102 upon which this symbol 103 is being displayed at a timing that matches the time point when the symbol 103 superimposes over the reference region 104. It should be understood that, since in this game machine 1 the large number of operation members 10 are provided as lined up over a comparatively long range in the transverse direction, accordingly whether it is more desirable for the user to operate the operation member 10 with the right hand or with the left hand varies according to the position of the operation member 10. Therefore, the sequence processing unit 40 may display the symbol 103 while changing its color, pattern, and other display characteristics according as to whether it is a symbol 103 for which operation with the right hand is recommended, or a symbol 103 for which operation with the left hand is recommended.

The timing at which the symbol 103 appears at the upper end portion of its lane 102 is set to be earlier than the operational timing of the operation to be commanded by this symbol 103, by a predetermined number of seconds. As an example, the timing of appearance of the symbol 103 may be set at a time point that is earlier than the operational timing by a time interval equivalent to two bars of the musical piece. Accordingly, if the center of the reference region 104 is taken as being the present time point Ta in the game, then a symbol 103 positioned at the upper end portion of its lane 102 shows that the corresponding operational timing will arrive at time point Tb which is a predetermined number of seconds later than the present time point. Moreover, the distance in the vertical direction from the reference region 104 to each of the symbols 103 indicates the time difference $\Delta T$ from the present time point to the operational timing being commanded by that symbol 103.

On the basis of the sequence data 45, the sequence processing unit 40 determines which are the operations whose operational timing will arrive during the period from the present time point Ta to the time point Tb the predetermined number of seconds later, and calculates the position of each symbol 103 so that the symbols 103 are disposed at positions upon the lanes 102 corresponding to these determined operational positions separated from the reference region 104 by a distance just corresponding to the time difference $\Delta T$. By repeating this type of processing according to the cycle for drawing the operation command screen 100, an image is displayed upon the main monitor 3 in which the symbols 103 for each lane 102 of the operation command screen 100 gradually come downward and arrive at the reference region 104 at their operational timings. By doing this, the user is sequentially commanded to perform the operations described in the sequence data 45, and the user is enabled to play the game by operating the operation members 10 according to those commands. It should be understood that, when the user is commanded to operate an operation member 10 of the second input unit 4b, it will be acceptable for adjustment to be performed so as to vary the display form of the symbol 103, for example its shape, size, color, or pattern, from the display form of the symbol 103 corresponding to the first input unit 4a. Alternatively, it will also be acceptable to display the screen into two sections in the vertical direction to distinguish commands for the input units 4a and 4b by dividing the screen into an operation command screen 100 that corresponds to the first input unit 4a and an operation command screen 100 that corresponds to the second input unit 4b. Commands for operation upon the second input unit 4b may be given at the same cadence as commands for operation upon the first input unit 4a, or alternatively operations may in principle be given for operation upon the first input unit 4a, while, in special or exceptional cases, special symbols 103 in a different display mode may be displayed in order to give commands for operation upon the second input unit 4b. There is no need for the lanes 102 necessarily to extend as straight lines in the vertical direction. Parts or all of the lanes 102 may be defined so as to be drawn as curves. Moreover, the speed of shifting of the symbols 103 is not limited to being a constant speed, and their speed may be varied as appropriate. And it will be acceptable for the display of the symbols 103 to be controlled so that a difference between the lanes 102 is set up in the speeds of shifting of the symbols 103.

While the sequence processing unit 40 is commanding the user to perform operation according to the processing described above, in parallel therewith, the operation evaluation unit 41 evaluates the play by the user on the basis of comparison between the commands of the operations as recorded in the sequence data 45 and the operations by the user as detected by the magnetic sensors 16b of the input system 4 (i.e. the operations that the user has actually performed). The higher is the matching degree between the operations commanded based on the sequence data 45 and the operations performed by the user, the higher is the evaluation of the play of the user. The matching degree is determined both from the standpoint of the operational positions and from the standpoint of the operational timings. Here, the evaluation of the matching degree of the operational timings may be performed in the same manner as in the case of a per se known music game machine, which performs evaluation in several stages on the basis of the amounts of deviation between the timings of the commanded operations based on the sequence data 45 and the detected timings of the operations. On the other hand, in relation to the operational positions, these are evaluated on the basis of whether the designated operation members 10 have been correctly operated or not. However, in the evaluation by the operation evaluation unit 41, in consideration of the facts that the spacing P between the operation members 10 on the input system 4 is tight and that it is possible to perform operation so that, during operation of one of the operation members 10, that operation may involve and catch against one of the adjacent operating members 10, the presence or absence of operation of the target operation member 10 is determined by employing a specific determination technique, as will now be described. This will now be explained in the following.

(1) Setting of the Range of Determination and the Valid Number of Detections

Figure 9:
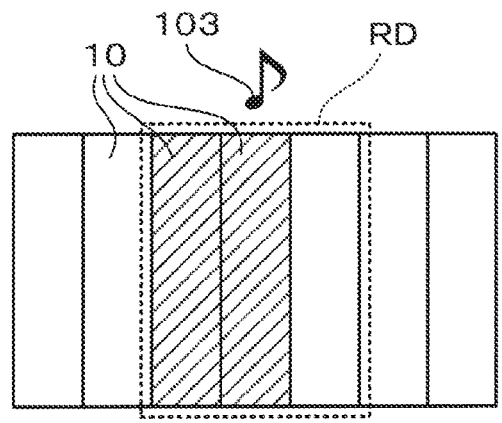
FIG. 9 is a figure showing an example of a range of determination that is set for commanding one operation.

As described above, the spacing P of the operation members 10 is narrow. Accordingly, when the user attempts to operate the designated operation member 10, instead of or in addition to operating this operation member 10, the user may operate one of the adjacent operation members 10. Accordingly, as shown in FIG. 9, the operation evaluation unit 41 sets a determination range RD having a predetermined width so as to include a continuous plurality of operation members 10 in the transverse direction with reference to the operation member 10 whose operation has been designated. In the example shown in FIG. 9, if it is supposed that the operation member 10 to which the symbol 103 is affixed is designated as being the subject to be operated, then a range that includes the three successive operation members 10 around this operation member 10 as a center is set as the range of determination RD having the predetermined width. In this case, the range of determination RD is set symmetrically to the left and right around the operation member 10 as center. Furthermore, the operation evaluation unit 41 sets a valid number of detections as the number of operation members 10 within the range of determination RD for which simultaneous operation is to be permitted. This valid number of detections is set to a value that is two or more, and moreover that is fewer than the number of operation members 10 included in the range of determination RD. In the example shown in FIG. 9, the valid number of detections is set to two.

Furthermore, when operation of any single operation member 10 is designated, if, within the range of determination RD corresponding to that single operation member 10 (in the following, sometimes this will be referred to as the "designated operation member"), operation that does not exceed the valid number of detections has been detected, then the operation evaluation unit 41 determines that operation has been performed upon that designated operation member 10, whereas, if operation that exceeds the valid number of detections has been detected, then the operation evaluation unit 41 determines that operation has not been performed upon that designated operation member 10. Accordingly, if for example in FIG. 9 operation of the two operation members 10 within the range of determination RD identified by hatching has been detected, then it is determined that operation has been performed upon the designated operation member 10, since this number of detections, i.e. two, does not exceed the valid number of detections. On the other hand, if detection of the three operation members 10 within the range of determination RD has been detected, then it is determined that operation has not been performed upon the designated operation member 10, since this number of detections, i.e. three, exceeds the valid number of detections.

According to the determination method described above, even when the user tries to operate the designated operation member 10 but performs operation so as to catch against and involve an adjacent operation member 10 instead of, or in addition, to that designated operation member 10, it is determined that the designated operation member 10 has been operated if the number of operation members 10 that are operated simultaneously is two or fewer. Due to this, the criterion for determination in relation to whether or not the user has operated the designated operation member 10 correctly is relaxed. Accordingly, even if the spacing P of the operation members 10 is set to be tight, the inconvenience of forcing the user to perform excessively strict operation is avoided. On the other hand, since it is determined that operation upon the designated operation member 10 has not been performed, if a number of operations that exceeds the valid number of detections are detected simultaneously. Accordingly, if the user has performed operation at the same time upon a large number of the operation members 10 that exceeds the permitted limit, it is possible to consider that this operation has not occurred, and to exclude this operation from the operations that are to be the subjects of evaluation. Thus, it is determined that operation has been performed correctly, if the user has operated the operation member 10 at the designated position substantially correctly, while, if the user intentionally has operated a large number of the operation members 10, then it is determined that no operation has been performed. Since the spacing P of the operation members 10 is tight, an occurrence of a sense of discomfort will be low, even if there is some deviation in the position of operation. Thus, it is possible to relax the criteria for determination, without any fear that the interest of the game will be deteriorated.

By setting the range of determination RD with reference to the designated operation member 10, it is possible moderately to limit the permitted range of deviation in the transverse direction between the designated operation member 10 and the position where the user performs operation (i.e. the operation member 10 that the user operates). In particular, by setting the range of determination RD symmetrically in the transverse direction about the designated operation member 10 as center, it is possible to permit deviation of the position where the user performs operation upon the designated operation member 10 over equal ranges to the left and to the right. Furthermore, the valid number of detections is set to be fewer than the number of operation members 10 that are included in the range of determination RD. Accordingly, it is possible to eliminate inappropriate operations from the operations that are the subjects of evaluation, such as when the user operates an excessively large number of the operation members 10 at the same time. For example, in a case in which the user does not attempt to operate the designated operation member 10 correctly with fingers, but instead operates a large number of operation members 10 in the vicinity of the designated operation member 10, continuing beyond the operation member 10 within the range of determination RD at the same time by employing an arm or the like, then it is possible to determine that this type of operation is inappropriate operation so that it can be excluded from the subjects of evaluation, since the number of detections of operation within the range of determination RD matches the number of operation members 10 within the range of determination RD.

(2) Adjustment of the Range of Determination During Successive Operations

When setting the range of determination and determining the presence or absence of operation upon the designated operation member, there is a possibility that inappropriate determination will be performed, due to the relationship between one operation and a subsequent operation thereof. For example, if the position where the subsequent operation is to be performed is displaced to one side or to the other side in the transverse direction with respect to the preceding one operation, and also the ranges of determination to be set in relation to those operations have a portion that is overlapped, then there is a possibility that it will be determined that the subsequent operation has been performed correctly, if the user operates the same operation member in response to the command for the one operation and the command for the subsequent operation, or even if, as viewed from the operation member that the user has operated in accordance with the command for the one operation, an operation member that is positioned at the other side thereof is operated by the user in response to the command for the subsequent operation.

Figure 10A:
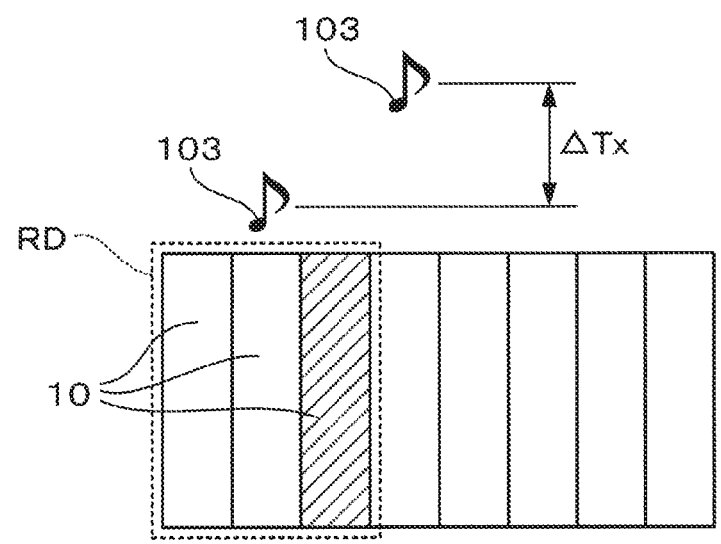
FIG. 10A is a figure showing a relationship, when successive operations have been commanded, between the position of a precedent operation and its range of determination.

For example, as shown in FIG. 10A, when a precedent left side symbol 103 and a subsequent symbol 103 that follows that symbol 103 with a predetermined time difference ΔTx are displayed, it will be supposed the range of determination RD is set to include three of the operation members 10 centered upon the operation member 10 corresponding to the precedent symbol 103, and that operation upon the operation member 10 that is positioned the right end of this range of determination RD and that is shown by hatching has been detected. It is determined that this operation is an operation corresponding to the symbol 103 on the left. On the other hand, the operation member 10 that is commanded by the subsequent symbol 103 is located on the right side of the operation member commanded by the precedent symbol 103, separated therefrom by just two of the operation members 10. In this situation, if the range of determination RD is set so that three of the operation members 10 centered upon the operation member 10 that is next to be operated are included, then the operation member 10 that was operated corresponding to the precedent symbol 103 is included in this range of determination RD. Accordingly, if the user performs operation upon the same operation member 10 corresponding to the next symbol 103, then it is determined that appropriate operation has been performed for the next symbol 103, irrespective of the fact that the command for the position to be operated upon is different from that of the precedent symbol 103.

In order to avoid such inconvenience, in a case in which two successive operations within a predetermined time difference are commanded, in which operation is detected within the range of determination RD for the command for the preceding one operation, and in which the detected position of the precedent operation is included in the range of determination RD when this range of determination RD is set for the subsequent operation according to the principle, the operation evaluation unit 41 exceptionally executes processing for adjusting the range of determination RD so that this detected position is not included therein. For example, when operation as shown in FIG. 10A is detected, then, as shown in FIG. 10B, the range of determination RD corresponding to the operation commanded by the subsequent symbol 103 is adjusted by setting the range of determination RD corresponding to the operation commanded by the subsequent symbol 103 so as to be displaced towards the right side, so that the operation member 10 for which the precedent operation was detected is not included.

If the range of determination RD is adjusted as described above, then, when the user operates any of the operation members 10 within the range of determination RD in accordance with the operation commanded by the precedent symbol 103, for the command corresponding to the subsequent symbol 103, it is not determined that the operation corresponding to the subsequent symbol 103 has been appropriately performed unless the user operates an operation member 10 that is positioned more to the right side than the operation member 10 that the user precedingly operated.

In this manner, if two operations, i.e. a precedent operation and a subsequent operation, are commanded whose positions are different and for which there is a possibility that their ranges of determination RD overlap, then it is eliminated that, even if the user operates the same operation member 10, or if the user operates an operation member 10 that is positioned as displaced therefrom in the opposite direction, this operation will be mistakenly determined as being appropriate operation corresponding to the command for the subsequent operation.

Figure 10B:
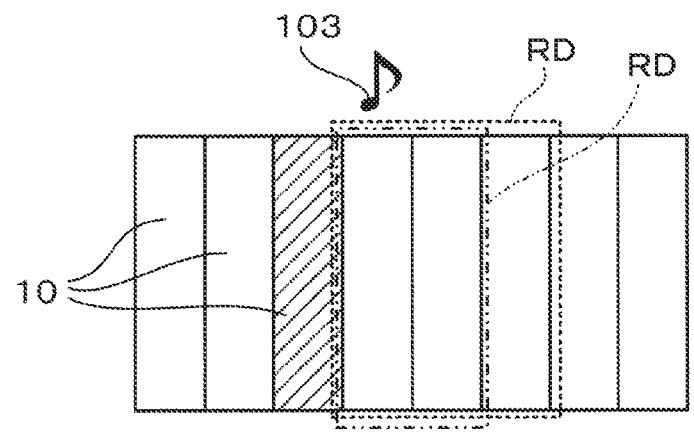
FIG. 10B is a figure showing an example, when successive operations have been commanded, of adjustment of the range of determination for the subsequent operation.

In the example shown in FIG. 10B, the width of the range of determination RD in the transverse direction is kept constant, in other words the width is maintained at a width equivalent to three of the operation members 102, while the range of determination RD is shifted toward one side or the other in the transverse direction. However, it would also be acceptable to adjust the range of determination RD corresponding to the operation commanded by the subsequent symbol 103 by narrowing down the width of the range of determination RD corresponding to the subsequent symbol 103, so that the operation member for which the precedent operation was detected is not included therein. In the example shown in FIG. 10B, as shown by the double-dotted chain lines in that figure, it would also be acceptable for the width of the range of determination RD to be narrowed down on its right side, so that only two of the operation members 10 are included. Adjustment of the range of determination RD is only applied when the time difference ΔTx between the timing at which the one operation is to be performed and the timing at which the subsequent operation is to be performed is within a predetermined time period range. When this time difference ΔTx is short, the possibility is high that the user will not be able to keep up with successively commands for operations whose positions are different, and that a failure will occur of operating the same operation member 10 or of operating the operation member 10 which is positioned in the opposite direction. Accordingly, it is desirable appropriately to determine the suitability of operation without overlooking this type of failure. On the other hand, if the time difference ΔTx is moderately long, then the user is able to encounter the subsequent operation with time to spare. Accordingly, in this type of case, in principle it is desirable to set the range of determination RD with reference to the operation member 10 to be operated in the subsequent operation. However, alternatively, it would also be acceptable to apply processing for adjusting the range of determination RD while taking as subjects the two operations that are in the temporal relationship of being precedent and subsequent, without taking into consideration the magnitude of the time difference ΔTx.

(3) Determination when Simultaneous Operations are Commanded

When simultaneous operation of a plurality of the operation members 10 has been requested, there is a possibility that an overlapped region may be present between the ranges of determination respectively corresponding to at least two of the operations, and moreover that operation in this overlapped region may be detected. In this case, the operation evaluation unit 41 allocates the operation detected in the overlapped region as being an operation that has been detected in either one of the two ranges of determination, and, in relation to the other range of determination, eliminates the operation that has been allocated to the above one range of determination in making a determination as to whether or not operation in that other range of determination has been detected. However, as described above, a valid number of detections is set for each of the ranges of determination. Accordingly, when determining the range of determination to which the operation detected in the overlapped region is to be allocated, each of the number of detections of operation on the left side range of determination and the number of detections of operation on the right side range of determination with respect to the overlapped region both should become less than or equal to their respective valid numbers of detections. Then, if it is possible to allocate the operation detected in the overlapped region to either the left or the right range of determination, this allocation is executed, while, if it is impossible to perform this allocation, it is considered that operation has not been performed within at least one of the left and right ranges of determination.

In the following, an example of the determination processing when simultaneous operations are commanded will be explained with reference to FIGS. 11A through 11G. FIGS. 11A through 11G show an example in which simultaneous operations upon three different operation members 10 are commanded, and moreover overlapped regions OR are created between the ranges of determination RD that are set corresponding to those operations. It should be understood that, in FIGS. 11A through 11G, the symbols 103 and the ranges of determination RD corresponding to those symbols 103 are distinguished from one another by the suffixes a through c, and moreover the overlapped regions OR are distinguished from one another by the suffixes 1 and 2.

Figure 11A:
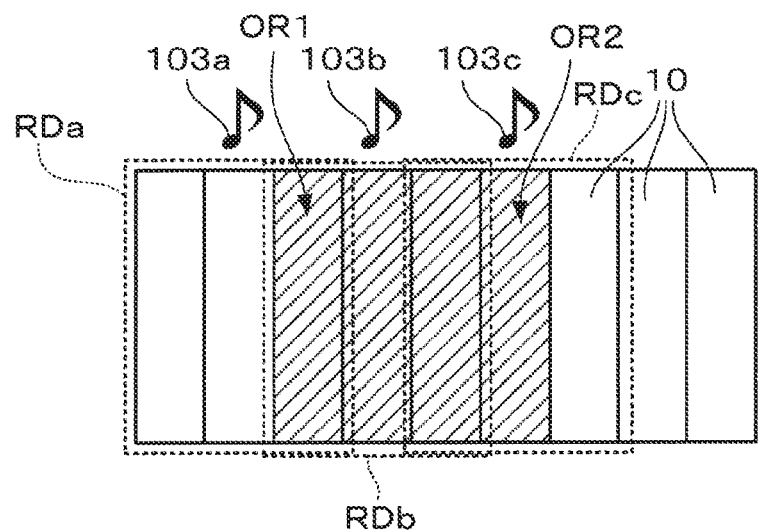
FIG. 11A is a figure showing an example, when several simultaneous operations have been commanded, of a relationship between respective positions of the commanded operations, their ranges of determination, and the detected positions of the operations.
Figure 11B:
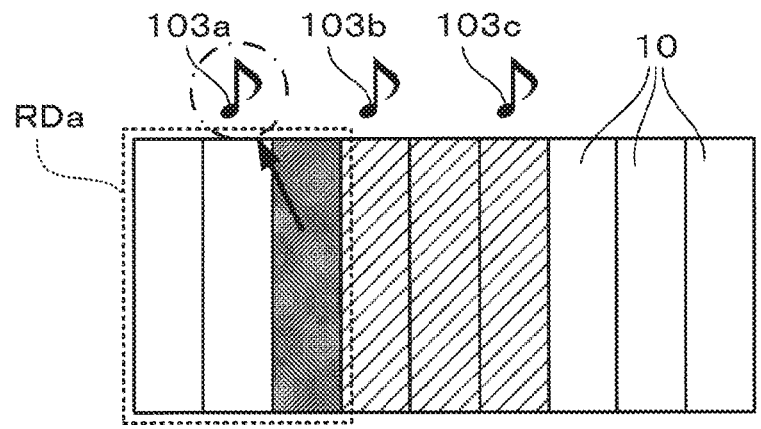
FIG. 11B is a figure showing an example of allocation to a left side range of determination of an operation in an overlapped region of the ranges of determination.

As shown in FIG. 11A, it will be supposed that operation has been detected of the four operation members 10 shown by hatching in the figure corresponding to operations commanded by the three symbols 103a through 103c. In this example, overlapped regions OR1 and OR2 are created between the ranges of determination RDa through RDc that are set based upon the operating members 10 corresponding to each of the three symbols 103a through 103c respectively as references. Each of the overlapped portions OR1 and OR2 includes one of the operating members 10, and operation of those operating members 10 is detected in each of the overlapped regions OR1 and OR2. In this case, first, when examining the range of determination RDa corresponding to the symbol 103a on the left side, the number of detections of this range of determination RDa is fewer than the number of detections of the range of determination RDb on its right side. Due to this, as shown in FIG. 11B, among the four operation members 10, operation upon the operation member 10 that is included in the overlapped region OR1 is allocated as being an operation detected in the range of determination RDa on the left side of the overlapped region OR1. In other words, among the four operation members 10, operation upon the operation member 10 that is included in the overlapped region OR1 is considered as being operation that is performed corresponding to the symbol 103a on the left side. In the following, it will be supposed that the allocated operation members 10 will be illustrated as colored in dark gray, as shown in FIG. 11B.

Figure 11C:
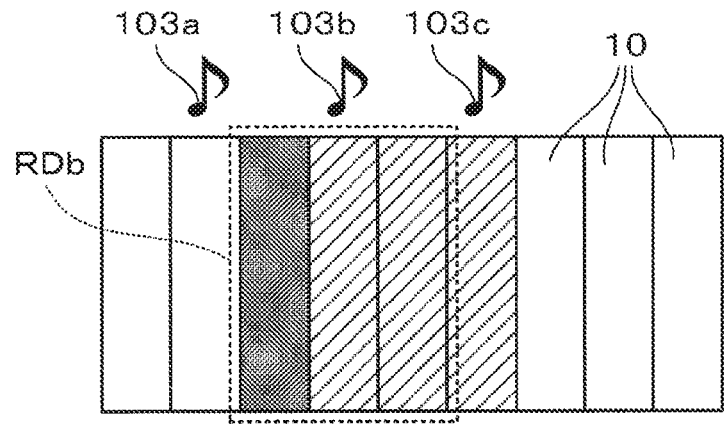
FIG. 11C is a figure showing a relationship between another range of determination after allocation of an operation according to FIG. 11B, and the detected position of the operation.
Figure 11D:
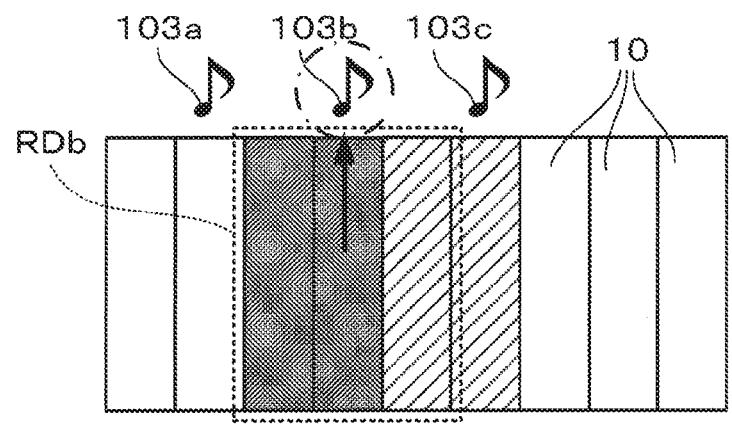
FIG. 11D is a figure showing an example of allocation to a center range of determination of part of the operations in the center range of determination from the state of FIG. 11C.

Next, as shown in FIG. 11C, when examining the range of determination RDb centered upon the operation member 10 corresponding to the center symbol 103b, although operation of the three operation members 10 in this range of determination RDb is detected, the operation of the operation member 10 on the left side, in other words the operation of the operation member 10 in the overlapped region OR1, has already been allocated as being an operation in the range of determination RDa. Accordingly, it is excluded from determination relating to operations in the range of determination RDb. Thus, the number of detections of operation in the range of determination RDb is two, so that this number of detections is within the valid number of detections. In this case, although it is possible to allocate each of the operations of the operation members 10 at the center and the right side of the range of determination RDb as being operations detected in the range of determination RDb, the number of detections in the range of determination RDc at the right side is the same, i.e. two. Accordingly, the operation of the operation member 10 included in the overlapped region OR2 is allocated to the range of determination RDc for the time being, and is excluded from determination of operations in the range of determination RDb. Due to this, as shown in FIG. 11D, operation of the operation member 10 that is positioned at the center of the range of determination RDb is allocated as being operation in the range of determination RDb. In other words, operation of the operation member 10 that is at the center of the range of determination RDb is considered to be an operation that is performed corresponding to the symbol 103b at the center.

Figure 11E:
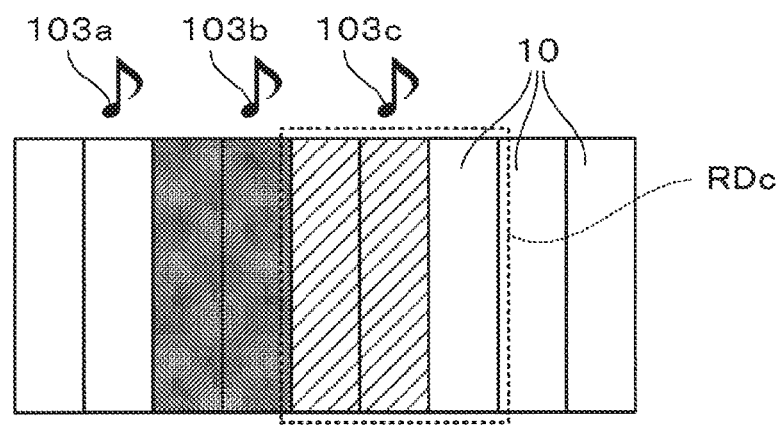
FIG. 11E is a figure showing a relationship between another range of determination after allocation of an operation according to FIG. 11D, and the detected position of the operation.
Figure 11F:
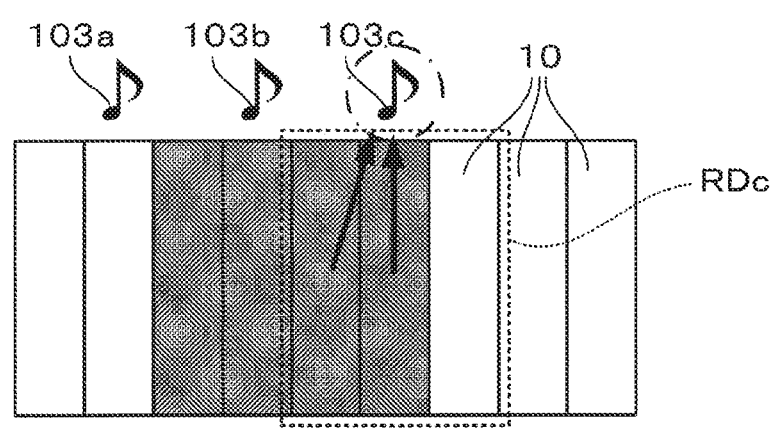
FIG. 11F is a figure showing an example of allocation of an operation in the range of determination on the right side from the state of FIG. 11E to a right side range of determination.

Next, as shown in FIG. 11E, when examining the range of determination RDc centered upon the operation member 10 corresponding to the symbol 103c on the right side, since the operation of the operation member 10 in the overlapped region OR2 is allocated as being an operation in the range of determination RDc on the right side, accordingly the number of detections of operation in the range of determination RDc is two. In this case, as shown in FIG. 11F, the operation of each of the operation members at the center and at the left side of the range of determination RDc is allocated as being operation detected in this range of determination RDc. In other words, operation of the operation members 10 that are at the center and at the left side of the range of determination RDc is considered to be operation performed corresponding to the symbol 103c at the right side.

When, with the operations of the operation members 10 in the overlapped regions OR1 and OR2 having been allocated to either one of the ranges of determination RD as described above, the number of detections in each range of determination RD is considered, the number of detections in each of the ranges of determination RDa and RDb is one, while the number of determinations in the range of determination RDc is two, and accordingly it is seen that, for each of the ranges of determination RD, the number of detections of operation is less than or equal to the valid number of detections. Accordingly, it is determined that operation has been performed appropriately in correspondence to each of the symbols 103a through 103c. It should be understood that, in the example described above, even if the operation on the operation member 10 of the overlapped region OR2 is taken as being allocated to the range of determination RDb in the center, still it will be determined that operation has been performed appropriately in correspondence to each of the symbols 103a through 103c.

Figure 11G:
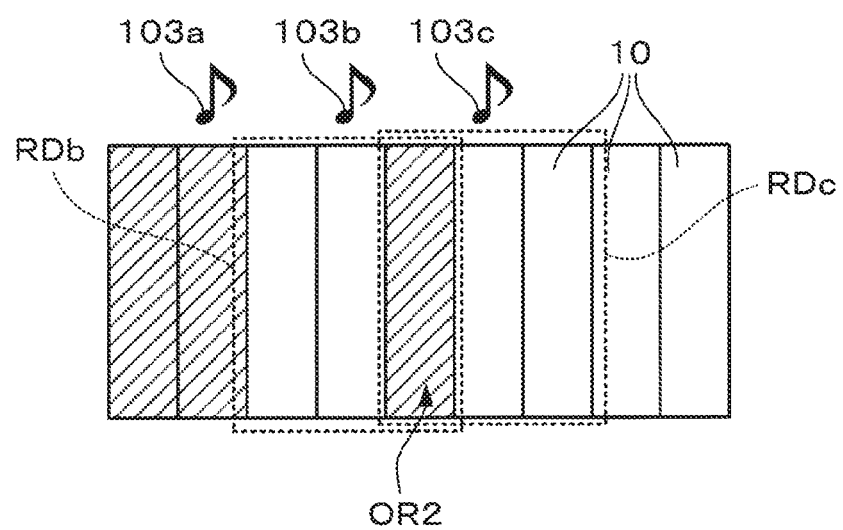
FIG. 11G is a figure showing an example of a case in which it is determined that no operation has been performed in a part of a range of determination.

FIG. 11G shows an example in which, contrary to the case in the example shown in FIGS. 11A through 11F, it is determined that operation of at least one symbol 103 has not been detected. In the example shown in FIG. 11G, in each of the range of determination RDb corresponding to the symbol 103b at the center and the range of determination RDc corresponding to the symbol 103c on the right side, only the operation upon the operation member 10 in the overlapped region OR2 is detected, but operation at other positions is not detected. Accordingly, if the operation upon the operation member 10 in the overlapped region OR2 is assigned to either one of the ranges of determination RDb and RDc, then the number of detected operations for the other range of determination becomes zero, and accordingly it has not been possible to divide up the operations that were detected in the overlapped region OR2 so as to consider that the operation has been detected for both of the ranges of determination RDb and RDc. Therefore, it is determined that no operation has been performed in relation at least one of the symbols 103b and 103c. However, in this type of case, it would also be acceptable to determine that operation has not been performed in relation to both of the symbols 103b and 103c.

The processing described above for setting the range(s) of determination and the valid number(s) of detections (the processing (1) described above), the processing described above for adjusting the range(s) of determination (the processing (2) described above), and the processing when simultaneous operations are designated (the processing (3) described above) do not necessarily need to be applied in all circumstances of the game. For example, since the processing (1) and (3) described above permits the user, within a moderate range, to operate some other operating position, either as a change to the commanded operation positions or in addition thereto, accordingly this yields the beneficial operational effect of relieving the user. Therefore, it would be acceptable to change whether or not it is possible to apply the above processing, in consideration of factors such as the level of experience (or of skill) of the user in the game, or the degree of difficulty of the game. For example, when a user whose experience is high is playing, or when the basic difficulty of the game itself is set to be comparatively high, then, instead of the processing (1) described above, the processing may be changed so that it is determined that appropriate operation has been performed on the condition that each operation member 10 that has been commanded is operated, and moreover that no adjacent operation member 10 is operated. In this case, the processing (3) described above is unnecessary, except if operation of two or more adjacent ones of the operation members 10 at the same time is designated. Accordingly, the user is required to perform more accurate operation, without any mistake in pressing the operation members 10 being allowed. On the other hand, when a beginner user who is not proficient in the game is playing, or when the degree of difficulty of the game is set to be low, then it will be acceptable for the processing (1) and the processing (3) described above to be applied, so that the user is moderately relieved. Moreover, with respect to the processing (2) described above, since it acts to reduce the latitude available for operation error during successive operations, accordingly this processing may not be applied when a beginner user is playing, or when the degree of difficulty of the game is set to be relatively low, so that the available tolerance is increased, while it may be arranged to apply the processing (2) when an experienced user is playing, or when the degree of difficulty of the game is set to be relatively high. Furthermore, it would also be acceptable to arrange for the user to be able to select whether or not the above types of processing (1) through (3) should be applied. Of course, it would also be acceptable to arrange for all of the above types of processing (1) through (3) to be applied in the game in all circumstances.

Figure 12:
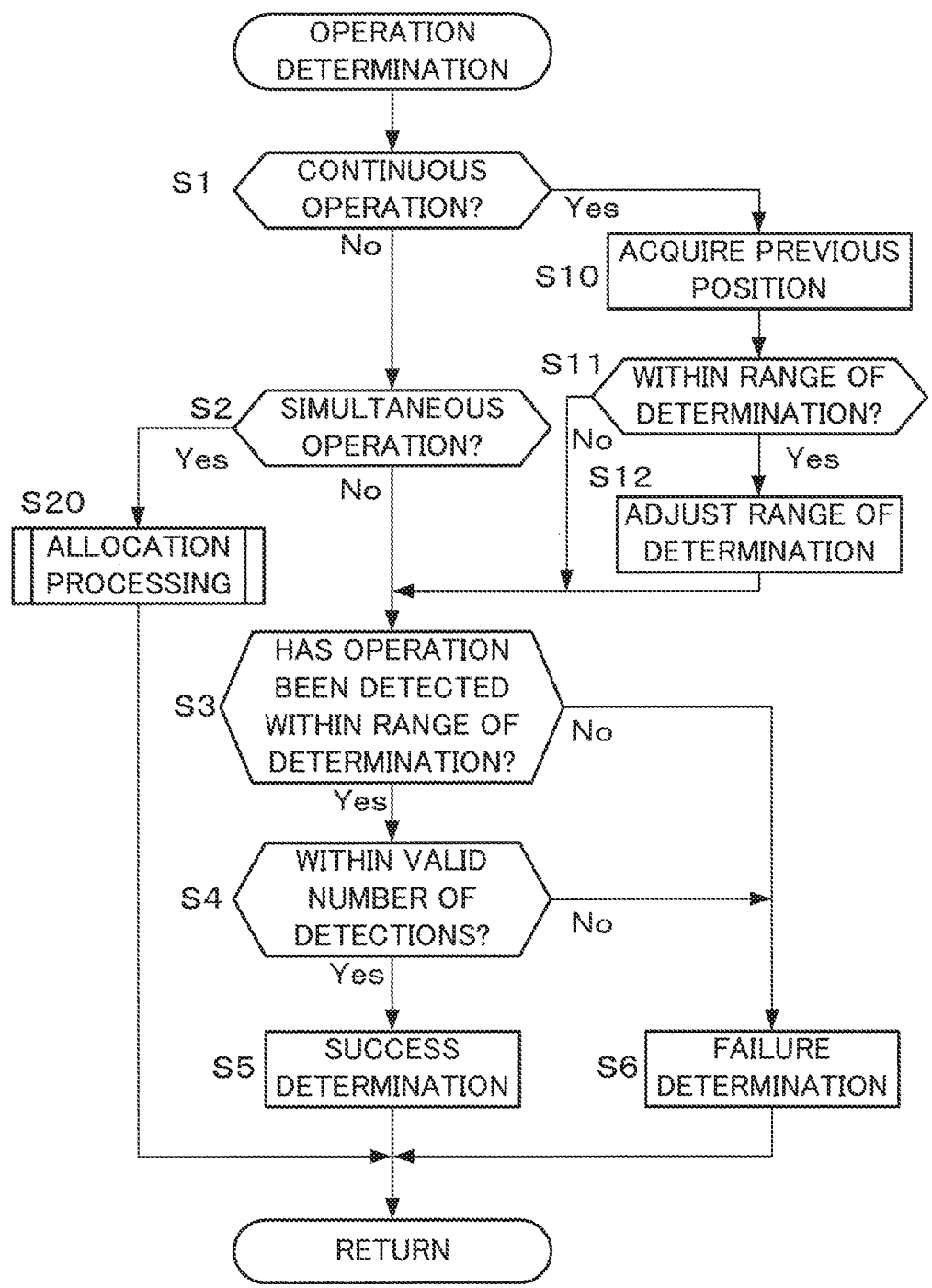
FIG. 12 is a flow chart showing a procedure for operation determination processing that is executed by the operation evaluation unit of FIG. 7 in order to make a determination as to whether or not an operation member at a commanded position has been operated.
Figure 13:
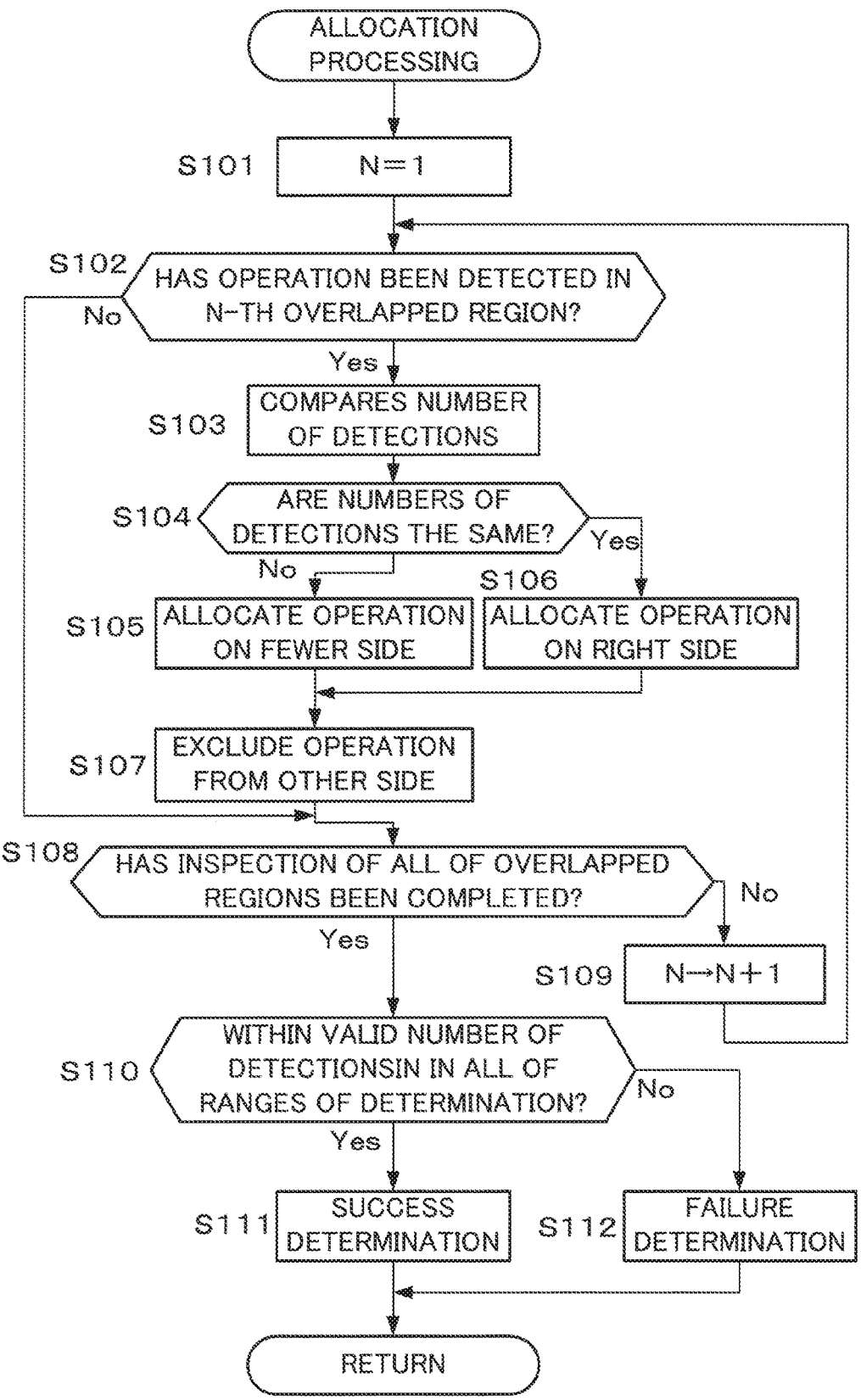
FIG. 13 is a flow chart showing a procedure for allocation processing, executed as processing of a subroutine of FIG. 12.

FIGS. 12 and 13 show an example of a procedure for operation determination processing that is executed by the operation evaluation unit 41 on a predetermined cycle, in order for the operation evaluation unit 41 to make a determination as to whether or not the user has performed operation, by using the above described determination logic. When the operation determination processing of FIG. 12 starts, first the operation evaluation unit 41 determines whether or not continuous operation is designated (step S1). The operation evaluation unit 41 determines that the continuous operation is designated when the time difference $\Delta Tx$ between the most recently operation determined by the operation determination processing and the subsequent operation designated as the next item by sequence data 45 is within a predetermined time interval. If continuous operation is not determined upon, then the operation evaluation unit 41 determines whether or not simultaneous operation of a plurality of operation members 10 is designated by the sequence data 45 (step S2). However, here, if the positions of the operation members 10 deviate within a range in which no overlapped region OR is created between the ranges of deviation RD, then the determination is made that simultaneous operation is not being commanded.

If it is determined in step S2 that simultaneous operation is not designated, then the operation evaluation unit 41 determines, on the basis of the output signals of the output system 4, whether or not any operation has been detected at the position for operation designated by the sequence data 45, in other words within the range of determination RD corresponding to the operation member 10 that is to be operated (step S3). If such operation is detected, then the operation evaluation unit 41 determines whether or not the number of detections of operation is within the valid number of detections (step S4). If the number of detections is within the valid number of detections, then the operation evaluation unit 41 determines that, according to the operations detected in this present cycle, operation of the operation member that was designated has succeeded (step S5). This determination is a success determination, in the sense that the position for the operation member 10 designated by the sequence data 45 and the position of operation coincide with one another within the permitted range. The deviation of the operational timing will be determined separately. On the other hand, in step S3, if it is decided that no operation has been detected, or if it is decided that the number of detections exceeds the valid number of detections, then the operation evaluation unit 41 determines that operation of the operation member 10 that was designated has failed (step S6). In this case, the determination is a determination that the operation member that was designated by the sequence data 45 has not been operated. The failure determination in step S6 is made either if an operation member 10 that is outside the range of determination RD has been operated, or if the number of operations of operation members 10 exceeds the valid number of detections, or if no operation member at all has been operated. In these cases, it will be acceptable for no influence at all to be exerted upon the evaluation of play, or, alternatively, it will also be acceptable for the user to suffer some disadvantage, for example some subtraction from the user's score.

In step S1, if it is determined that continuous operation is designated, then the operation evaluation unit 41 acquires the operating position detected by the previous cycle of operation determination processing (step S10). And next the operation evaluation unit 41 determines whether or not the detected position of operation in the previous cycle that has thus been acquired is within the range of determination RD that is to be set corresponding to the next operation (step S11). In other words, as shown in the example of FIG. 9, supposing that the range of determination RD has been set so as to include the three operation members 10 that succeed one another in the transverse direction about the operation member 10 that is to be operated next time as center, a determination is made as to whether or not the detected position of operation in the previous cycle is included within this range of determination RD. If it is determined that this position is not included within the range of determination RD, then the operation evaluation unit 41 transfers the flow of control to step S3. On the other hand, in this step S11, if it is determined that this position of operation is included within the range of determination RD, then the operation evaluation unit 41 adjusts the range of determination RD so that this detected position of operation in the previous cycle is not included in the range of determination RD for the present cycle. An example of such adjustment is shown in FIGS. 10A and 10B. After adjustment of the range of determination, the operation evaluation unit 41 transfers the flow of control to step S3.

In step S2, if it is determined that simultaneous operation is designated, then the operation evaluation unit 41 transfers the flow of control to the allocation processing routine in step S20. FIG. 13 shows the steps of this allocation processing routine. It should be understood that, in the routine of FIG. 13, it will be supposed that, in the ranges of determination RD, inspection is sequentially performed from left to right in the direction in which the operation members 10 are linearly arranged. When the allocation processing routine starts, first, the operation evaluation unit 41 sets a variable N that specifies the overlapped region OR to be the subject of inspection to 1. (step S101), and next determines whether or not operation of an operation member 10 in the N-th overlapped region OR is detected (step S102). If such operation is detected, then the operation evaluation unit 41 compares together the number of detections of operation in each of the ranges of determination RD that are on the left or the right of the overlapped region OR (step S103), and determines whether or not these numbers of detections are the same (step S104). If these numbers are not the same, then the operation evaluation unit 41 allocates the operation that has been detected in the overlapped region OR as being an operation detected in that one of the ranges of determination RD for which the number of detections is the fewer (step S105). On the other hand, if it is determined in step S104 that the numbers are the same, then the operation evaluation unit 41 allocates the operation that has been detected in the overlapped region OR as being an operation detected in the range of determination RD on the right side (step S106).

Next, the operation evaluation unit 41 excludes (step S107) operation in the overlapped region OR from the range of determination RD on the other side, in other words from the range of determination RD on the opposite side from the range of determination RD to which the operation was allocated in step S105 or step S106. The exclusion means exclusion from the subjects of counting the number of detections of operation. And next the operation evaluation unit 41 determines whether or not the inspections in steps S102 through S107 have been completed in relation to all of the overlapped regions OR (step S108). If they are not yet completed, then the operation evaluation unit 41 adds 1 to the variable N (step S109), and then the flow of processing returns to step S102. Moreover, if it is determined that no operation was detected in step S102, then the operation evaluation unit 41 skips steps S102 through S107, and the flow of control proceeds to step S108.

In step S108, if it is determined that inspection of all of the overlapped regions has been completed, then the operation evaluation unit 41 determines whether or not the number of detections of operation in any of the ranges of determination RD exceeds the number of valid detections, in other words, whether or not, in all of the ranges of determination RD, the number of detections of operation is within the valid number of detections (step S110). If, in all of the ranges of determination RD, the number of detections of operation is within the valid number of detections, then the operation evaluation unit 41 determines that all of the designated simultaneous operations have been successful (step S111). On the other hand, in step S110, if it is determined that, for at least one of the ranges of determination RD, the number of detections of operation is greater than the valid number of detections, then the operation evaluation unit 41 determines that a failure in simultaneous operation has occurred (step S112). In this case it may be determined that all of the designated operations have failed; or, alternatively, it may be determined that only operation of the operation member(s) 10 corresponding to the range(s) of determination RD for which the number of detections exceeds the valid number of detections has failed, whereas the other operations have been successful.

It should be understood that, since signals corresponding to the amounts of operation of the operation members 10 are outputted from the magnetic sensors 16b of the input system 4, accordingly, in relation to the determinations as to whether or not operations have been detected, it would also be possible for the amounts of operation further to be taken into consideration. For example, it may be determined that operation has been detected if the operation quantity exceeds some predetermined quantity, and it may be determined that operation has not been detected if the operation quantity is less than that predetermined quantity. For this, the magnitudes of the operation quantity of the operation members 10, or, to put it in another manner, the strengths of the pushing down operations upon the operation members 10, may be designated by the sequence data 45 by a series of steps, and information designating the strength of the operation may be added to each of the symbols 103 on the operation command screen 100, and it may be determined that operation has been detected and the processing described above is applied, if the operation member 10 is operated with an operation quantity corresponding to that designated strength. It would also be possible to give the user a feeling of playing upon a keyboard musical instrument or the like, and thus to enhance the interest of the game, by reflecting the magnitude of the operation quantity in, for example, the magnitude of a sound effect that is outputted corresponding to the operation of the operation member 10.

Figure 14:
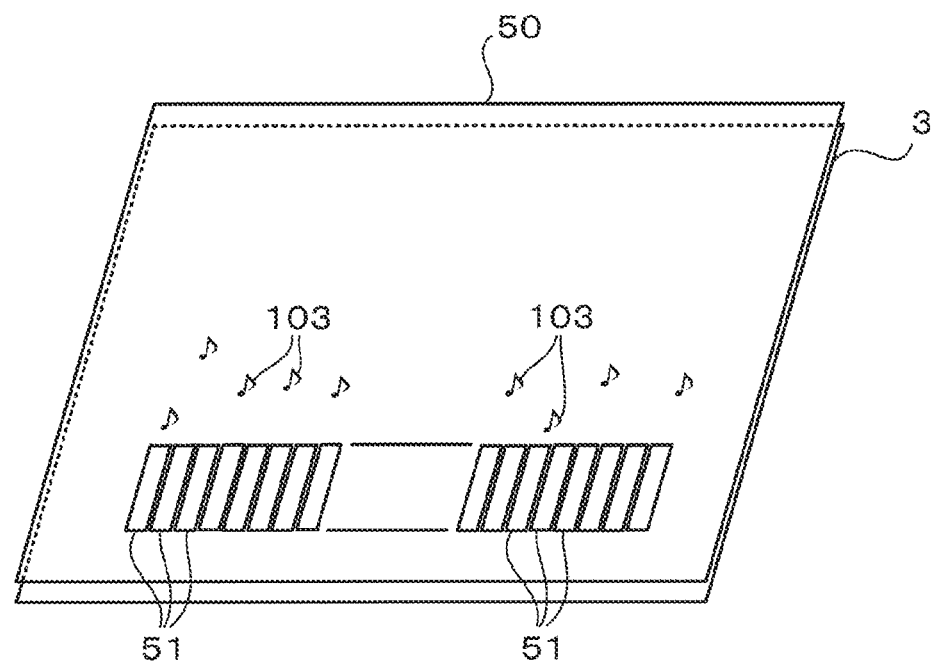
FIG. 14 is a figure showing a variant embodiment that employs a touch panel input device.

The determination technique described above can also be applied to a game machine that is provided with a touch panel input unit, instead of the input system 4 having physical operation members 10. For example, if, as shown in FIG. 14, a touch panel input unit 50 is overlaid upon the main monitor 3, and a plurality of operation units 51 arranged linearly along the transverse direction are set up on the touch panel input unit 50 by combining the display image on the main monitor 3 and this touch panel input unit 50, then it is possible to determine which of the operation units 51 has been operated by touch by employing the determination technique described above.

Figure 15:
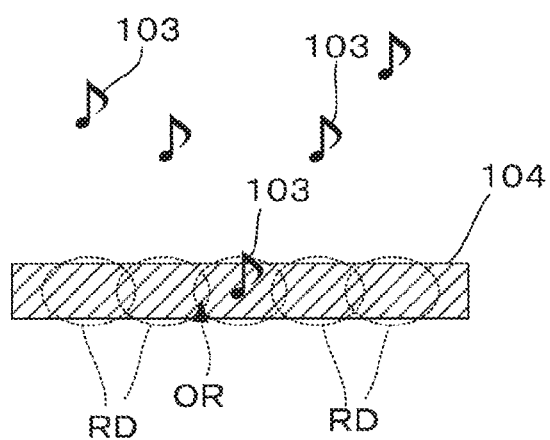
FIG. 15 is a figure showing another variant embodiment that employs a touch panel input device.

Furthermore, if such a touch panel input unit 50 is employed, the determination technique described above may be applied even if each of the plurality of operation units is not explicitly displayed to the user. As for example shown in FIG. 15, it would be possible, when a command is given for an operation such that the user is required to touch the position of a symbol 103 in accordance with the timing that the symbol 103 comes to overlap a reference region 104 upon an operation command screen 100 of the main monitor 3, to arrange for a range of determination RD having a fixed width to be set centered upon the position of the symbol 103, and to determine that the operation has been performed when operation within the valid number of detections has been detected within this range RD. Moreover, it would also be possible, during continuous operation, to apply adjustment to the above described range of determination RD. Yet further, it would also be possible to apply the allocation technique described above, if an overlapped region OR occurs between two such ranges of determination RD, and operation has been detected in this overlapped region OR.

Figure 16A:
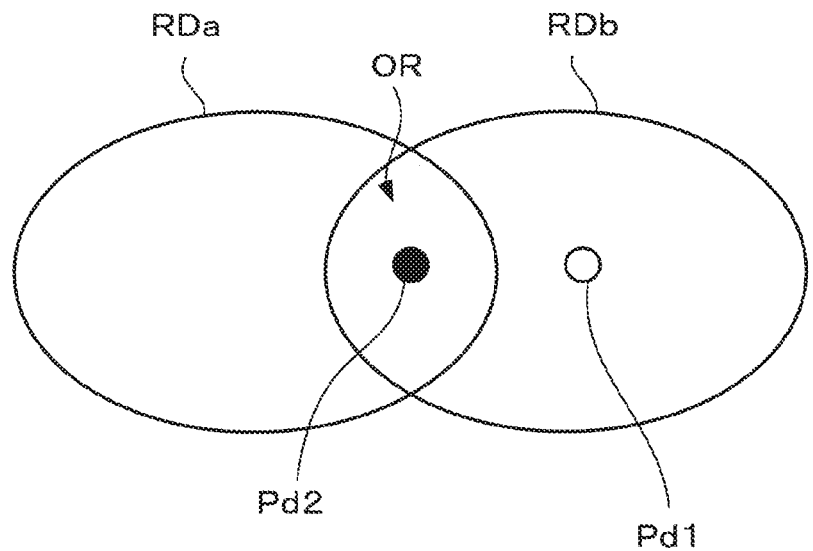
FIG. 16A is a figure showing an example of a case in which the determination technique of FIGS. 11A through 11E is employed upon the variant embodiment of FIG. 15.
Figure 16B:
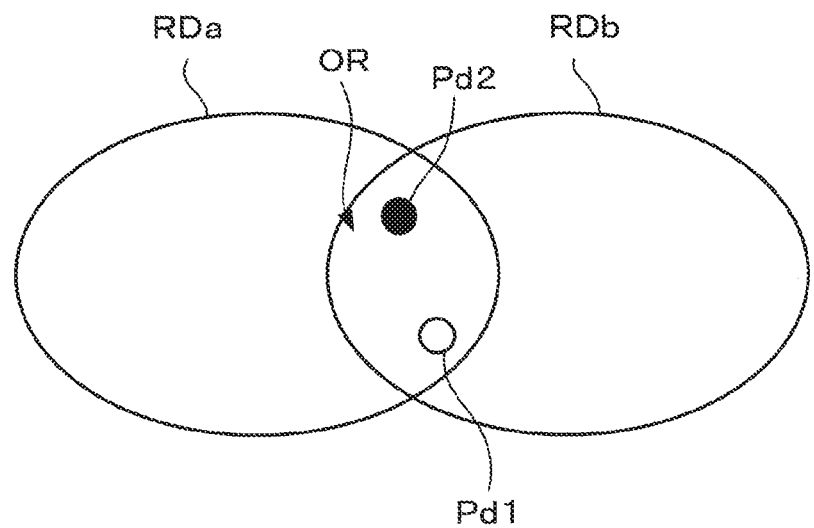
FIG. 16B is a figure showing an example of another case in which the determination technique of FIGS. 11A through 11E is employed upon the variant embodiment of FIG. 15.

For example, as shown in FIG. 16A, if an overlapped region OR occurs between two ranges of determination RDa and RDb, and two positions of detection Pd1 and Pd2 are present in the range of determination RDb while the position of detection Pd2 being one of them is present in the overlapped region OR between the range of determination RDa and the range of determination RDb. In this case, if the operation at this position of detection Pd2 is allocated to the range of determination RDa on the left side and whether or not operation is detected is determined by excluding this operation at the position of detection Pd2 from the range of determination RDb on the right side, then it is possible to determine that the operation has been performed in both of the ranges of determination RDa and RDb. And, as shown in FIG. 16B, when a plurality of positions of detection (two in the shown example) Pd1 and Pd2 are present in the overlapped region OR, then it will be sufficient to determine whether or not it is possible to allocate the operations at the positions of detection Pd1 and Pd2 to the ranges of determination RDa and RDb, so that the number of detections in each of the ranges of determination RDa and RDb does not exceed the valid number of detections. While the standard for allocation may be determined appropriately, as one example, in the case of FIG. 16B, by taking as clues the distances from the positions of detection Pd1 and Pd2 to the center positions of the ranges of determination RDa and RDb respectively, and by allocating each of the operations to that range of determination RD for which its distance to the center thereof is the smaller, it is possible to perform processing to allocate the operation at the position of detection Pd1 to the range of determination RDb on the right side and to allocate the operation at the position of detection Pd2 to the range of determination RDa on the left side.

While, in the examples shown in FIGS. 11A through 11G, a plurality of operations is not detected in the overlapped region OR since only a single operation member 10 is included in the overlapped region OR, it would also be acceptable to set the range of determination RD so that a plurality of operation members 10 is included in the overlapped region OR of the adjacent range of determination RD. In this case as well, it may be determined whether or not it is possible to allocate the plurality of operations detected in the overlapped region OR in an appropriate manner, in such a way that the number of detections of operation in the ranges of determination OR on both sides do not exceed the corresponding valid numbers of detections. For example, if a negative determination has been made in step S110 of the allocation processing of FIG. 13, then the processing in steps S102 through S110 may be repeated while increasing or decreasing the numbers of allocations in step S105 or step S106 in an appropriate manner, and thereby it may be determined whether or not a system of allocation exists, such that the numbers of detections in all of the ranges of determination RD do not exceed the valid numbers of detections corresponding to those ranges It should be understood that, in the example in which the touch panel input unit 50 is employed, the game machine 1 is not to be considered as being limited to a structure having a casing 2 as shown in FIGS. 1 through 3. The game machine may be built by employing a computer device of any of various types incorporating a touch panel, such as a portable game machine, a smart phone, a touch pad, a personal computer, or the like.

The present invention is not to be considered as being limited to the embodiment described above. It could be implemented with various changes or alterations. For example, the input system is not limited to the shown example in which two rows of operation members are arranged nearer and further as seen from the point of view of the user. The input system could consist of a single row of operation members arranged linearly, or of three or more rows. And the input system is not limited to the shown example in which the operation members are adapted to be operated by being depressed. For example, the input system may be constructed so that operation of each of the operation members is detected when the user touches its upper end surface. Moreover, the ranges of determination are not to be considered as being limited to the shown case in which they are set to include three of the operation members 10, arranged symmetrically with respect to the one operation member 10 whose operation has been designated as a center. The number of operation members 10 included in each range of determination may be varied as appropriate, provided that it is at least two. Furthermore, if the ranges of determination are set so as to include two of the operation members 10, then their valid numbers of detections may also be set to two. Yet further, the ranges of determination may be set asymmetrically with respect to the transverse direction. And while, as described above, a touch panel input unit may also be employed as an input system, in that case the ranges of determination can be set to any appropriate width, and are only limited by the resolving power of the touch panel input unit. Even further, the present invention is not limited to the shown examples in which it is built as a music game machine that commands operations in accordance with music. The present invention could also be applied to a game machine that allows a user to play a game of some genre other than a music game, provided that the game is of a form in which the user is commanded as to the positions and timings of operations to be performed by the user.

Various aspects of the present invention derived from each of the embodiments and variant embodiments detailed above will now be described. It should be understood that, in the following explanation, in order to facilitate understanding of each aspect of the present invention, the members corresponding to elements shown the attached drawings are labeled in parentheses, but this is not to be considered as being limitative of the present invention to the aspects in the drawings.

A game machine (1) according to one aspect of the present invention comprises an input device (4, 50) that is capable of detecting a position at which a user performs an operation, and a control device (31) that commands the user respective positions and timings at which a plurality of operations is to be performed by the user upon the input device, and that evaluates the operations by the user on the basis of comparison between the commanded operations and the operations performed by the user and detected by the input device: wherein the control device comprises an operation determination device (41, S1 through S20) that determines presence or absence of an operation corresponding to a command for any one operation, on the basis of whether or not the operation has been detected within a range of determination (RD) that is set to a predetermined width (for example, a width that includes three operation members 10) in a predetermined direction with reference to a position at which the one operation is to be performed in response to the command; and, when simultaneous operations at two or more different positions in relation to the predetermined direction are commanded and an overlapped region (OR) is generated between ranges of determination to be set corresponding to those operations, and when an operation is detected in the overlapped region, the operation determination device allocates (S105, S106) an operation detected in the overlapped region as an operation detected in one of the ranges of determination with respect to the overlapped region, and determines as to whether or not an operation in another of the ranges of determination has been detected by excluding (S107) the operation allocated to the one range of determination in relation to the other range of determination.

And a non-transitory computer readable recording medium storing a computer program (35) according to one aspect of the present invention is configured to cause a computer (30) of a game machine (1) comprising an input device (4, 50) that is capable of detecting a position at which a user performs an operation to function as a control device (31) that commands the user respective positions and timings at which a plurality of operations is to be performed by the user upon the input device, and that evaluates the operations by the user on the basis of comparison between the commanded operations and the operations performed by the user and detected by the input device; wherein the computer program: causes the control device to function as an operation determination device (41, S1 through S20) that determines presence or absence of an operation corresponding to a command for any one operation, on the basis of whether or not the operation has been detected within a range of determination (RD) that is set to a predetermined width (for example, a width that includes three operation members 10) in a predetermined direction with reference to a position at which the one operation is to be performed in response to the command; and, when simultaneous operations at two or more different positions in relation to the predetermined direction are commanded and an overlapped region (OR) is generated between ranges of determination to be set corresponding to those operations, and when an operation is detected in the overlapped region, the operation determination device allocates (S105, S106) an operation detected in the overlapped region as an operation detected in one of the ranges of determination with respect to the overlapped region, and determines as to whether or not an operation in another of the ranges of determination has been detected by excluding (S107) the operation allocated to the one range of determination in relation to the other range of determination.

It should be understood that the computer program according to one of the aspects of the present invention could also be supplied in the form of being stored upon a storage medium. By employing such a storage medium, it is possible to implement the game system of the present invention by using a computer, by for example installing and executing the computer program according to the present invention upon the computer. The storage medium upon which the computer program is stored may, for example, be a non-transitory storage medium such as a CD-ROM or the like.

In the game machine of the aspect described above, when a plurality of operations (as one example, Pd1 and Pd2 in FIG. 16B) is detected in the overlapped region, the operation determination device allocates a part of the plurality of operations (Pd2) to the one range of determination (RDa), and allocates remainder of the plurality of operations (Pd1) to the other range of determination.

Moreover, in the game machine of the aspect described above, when three or more simultaneous operations whose positions are different in relation to the predetermined direction are commanded and two or more overlapped regions (OR1, OR2) are generated between the ranges of determination corresponding to those operations, and when an operation is detected in each of the overlapped regions, the operation determination device, with respect to each of the overlapped regions, allocates the operation that has been detected in each of the overlapped regions as an operation that has been detected in one of ranges of determination, and determines as to whether or not an operation in another of the ranges of determination has been detected by excluding the operation that has been allocated to the one range of determination in relation to the other range of determination.

Moreover, in the game machine of any of the above aspects of the present invention, it would also be acceptable for the input device to be capable of detecting respective operations performed upon a plurality of operation units (10, 51) that are arranged linearly along the predetermined direction, for each of the operation units; and, when an operation is commanded for any one of the operation units, a range that includes a plurality of operation units arranged linearly along the predetermined direction with the one operation unit being taken as a reference is set as the range of determination of the predetermined width.

And, in the game machine of any of the above aspects of the present invention, it would also be acceptable for the predetermined direction to be a transverse direction from the point of view of the user.

Furthermore, it would also be acceptable for the gap (P) between the operation units in the transverse direction to be set to a range such that, when any one of the operation units is operated by a finger of the user, an operation unit adjacent to the one operation unit on at least one side thereof is operated by being contacted by the finger and being involved and caught.

As the plurality of operation units, the input device (4) may comprise a plurality of physical operation members (10) arranged linearly along the predetermined direction. Alternatively, as the input device, a touch panel input unit (50) may be provided that outputs a signal according to a position at which the user performs a touch operation, and each of the plurality of operation units (51) is established upon the touch panel input unit. In other words, while it is acceptable to provide the operation units as physical operation members, alternatively, it would also be acceptable to provide the operation units as logical operation units upon a touch panel input unit.

Yet further, in the game machine of any of the above aspects of the present invention, as the input device, it will also be acceptable for a touch panel input device (50) to be provided that outputs a signal according to the position at which the user performs a touch operation.

What is claimed is:

1. A game machine comprising an input system, having a plurality of operation units, that is capable of detecting a position at which a user performs an operation, and a computer that commands the user respective positions and timings at which a plurality of operations is to be performed by the user upon the input system, and that evaluates the operations by the user based on comparison between the commanded operations and the operations performed by the user and detected by the input system:
    wherein the computer determines presence or absence of an operation corresponding to a command for any one operation, based on whether or not the operation has been detected within a range of determination that is set to a predetermined width in a predetermined direction with reference to a position at which the one operation is to be performed in response to the command; and
    when simultaneous operations at two or more different positions in relation to the predetermined direction are commanded and an overlapped region is generated between ranges of determination to be set corresponding to those operations, and when an operation is detected in the overlapped region, the computer allocates an operation detected in the overlapped region as an operation detected in one of the ranges of determination with respect to the overlapped region, and determines as to whether or not an operation in another of the ranges of determination with respect to the overlapped region has been detected by excluding the operation allocated to the one range of determination.

2. The game machine according to claim 1, wherein, when a plurality of operations is detected in the overlapped region, the computer allocates a part of the plurality of operations to the one range of determination, and allocates remainder of the plurality of operations to an other range of determination.

3. The game machine according to claim 1, wherein, when three or more simultaneous operations whose positions are different in relation to the predetermined direction are commanded and two or more overlapped regions are generated between the ranges of determination corresponding to those operations, and when an operation is detected in each of the overlapped regions, the computer, with respect to each of the overlapped regions, allocates the operation that has been detected in each of the overlapped regions as an operation that has been detected in one of ranges of determination, and determines as to whether or not an operation in another of the ranges of determination has been detected by excluding the operation that has been allocated to the one range of determination in relation to an other range of determination.

4. The game machine according to claim 1, wherein:
    the input system is capable of detecting respective operations performed upon the operation units that are arranged linearly along the predetermined direction, for each of the operation units; and
    when an operation is commanded for any one of the operation units, a range that includes a plurality of operation units arranged linearly along the predetermined direction with the one operation unit being taken as a reference is set as the range of determination of the predetermined width.

5. The game machine according to claim 1, wherein the predetermined direction is a transverse direction from the point of view of the user.

6. The game machine according to claim 5, wherein the gap between the operation units in the transverse direction is set to a range such that, when any one of the operation units is operated by a finger of the user, an operation unit adjacent to the one operation unit on at least one side thereof is operated by being contacted by the finger and being involved and caught.

7. The game machine according to claim 4, wherein, as the plurality of operation units, the input system comprises a plurality of physical operation members arranged linearly along the predetermined direction.

8. The game machine according to claim 1, wherein, as the input system, a touch panel input unit is provided that outputs a signal according to a position at which the user performs a touch operation.

9. The game machine according to claim 4, wherein, as the input system, a touch panel input unit is provided that outputs a signal according to a position at which the user performs a touch operation, and each of the plurality of operation units is established upon the touch panel input unit.

10. A non-transitory computer readable recording medium storing a computer program that is adapted to cause a computer of a game machine comprising an input system, having a plurality of operation units, that is capable of detecting a position at which a user has performs an operation, to command the user respective positions and timings at which a plurality of operations is to be performed by the user upon the input system, and to evaluate the operations by the user based on comparison between the commanded operations and the operations performed by the user and detected by the input system; wherein the computer program:
    causes the computer to determine presence or absence of an operation corresponding to a command for any one operation, based on whether or not the operation has been detected within a range of determination that is set to a predetermined width in a predetermined direction with reference to a position at which the one operation is to be performed in response to the command; and when simultaneous operations at two or more different positions in relation to the predetermined direction are commanded and an overlapped region is generated between ranges of determination to be set corresponding to those operations, and when an operation is detected in the overlapped region, the computer allocates an operation detected in the overlapped region as an operation detected in one of the ranges of determination with respect to the overlapped region, and determines as to whether or not an operation in another of the ranges of determination with respect to the overlapped region has been detected by excluding the operation allocated to the one range of determination.

\* \* \* \* \*